(12) United States Patent
Zhang et al.

(10) Patent No.: US 11,876,005 B2
(45) Date of Patent: Jan. 16, 2024

(54) METHODS AND APPARATUS FOR CLEANING FLIP CHIP ASSEMBLIES

(71) Applicant: ACM Research (Shanghai) Inc., Shanghai (CN)

(72) Inventors: Xiaoyan Zhang, Shanghai (CN); Fuping Chen, Shanghai (CN); Hui Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 0 days.

(21) Appl. No.: 16/389,568

(22) Filed: Apr. 19, 2019

(65) Prior Publication Data
US 2019/0244837 A1 Aug. 8, 2019

Related U.S. Application Data

(62) Division of application No. 14/346,163, filed as application No. PCT/CN2011/080011 on Sep. 22, 2011, now abandoned.

(51) Int. Cl.
*H01L 21/02* (2006.01)
*H01L 21/67* (2006.01)
*H01L 23/00* (2006.01)

(52) U.S. Cl.
CPC .. *H01L 21/67051* (2013.01); *H01L 21/02052* (2013.01); *H01L 21/67023* (2013.01);
(Continued)

(58) Field of Classification Search
CPC ......... H01L 21/68771; H01L 21/68778; H01L 2224/81911; H01L 21/02041; B08B 3/12
See application file for complete search history.

(56) References Cited

U.S. PATENT DOCUMENTS 5,778,913 A * 7/1998 Degani ............. H01L 21/67051
134/153
2002/0197853 A1* 12/2002 Nagai ....................... B08B 3/10
438/639
(Continued)

FOREIGN PATENT DOCUMENTS

JP       H1041263 A   *  2/1998
JP     2005349301 A   * 12/2005

OTHER PUBLICATIONS

JP2005349301—Machine Translation (Year: 2005).*
JPH1041263—Machine Translation (Year: 1998).*

*Primary Examiner* — Marc Lorenzi
(74) *Attorney, Agent, or Firm* — Osha Bergman Watanabe & Burton LLP

(57) ABSTRACT

An apparatus for cleaning flip chip assemblies is provided. The apparatus comprises: a chuck assembly; a motor coupled to the chuck assembly by a spindle; at least one carrier for holding flip chips; at least one spray nozzle for directing DIW, a cleaning solution, a gas or a vapor. Embodiments of the invention further provide methods for cleaning flip chip assemblies. The method comprises: loading at least one flip chip to the flip chip carriers; rotating the chuck assembly at a rotation speed; flowing DIW for rinsing the flip chips; flowing a cleaning solution for removing the contaminants; applying ultrasonic/megasonic energy to the flip chips; blowing a gas or a vapor via the spray nozzles for drying the flip chips; bringing the flip chips out of the flip chip carriers.

4 Claims, 15 Drawing Sheets

(52) U.S. Cl.
CPC .............. *H01L 24/75* (2013.01); *H01L 24/16* (2013.01); *H01L 24/81* (2013.01); *H01L 2224/131* (2013.01); *H01L 2224/16225* (2013.01); *H01L 2224/16227* (2013.01); *H01L 2224/7501* (2013.01); *H01L 2224/81911* (2013.01)

(56) References Cited

U.S. PATENT DOCUMENTS

| | | | | |
|---|---|---|---|---|
| 2003/0164179 | A1* | 9/2003 | Kamikawa | H01L 21/67781 134/25.4 |
| 2012/0090642 | A1* | 4/2012 | Matsuzawa | H01L 21/68771 134/25.1 |
| 2013/0050468 | A1* | 2/2013 | Golan | G01N 21/9501 348/87 |
| 2013/0068727 | A1* | 3/2013 | Okita | H01L 21/68764 216/59 |

* cited by examiner

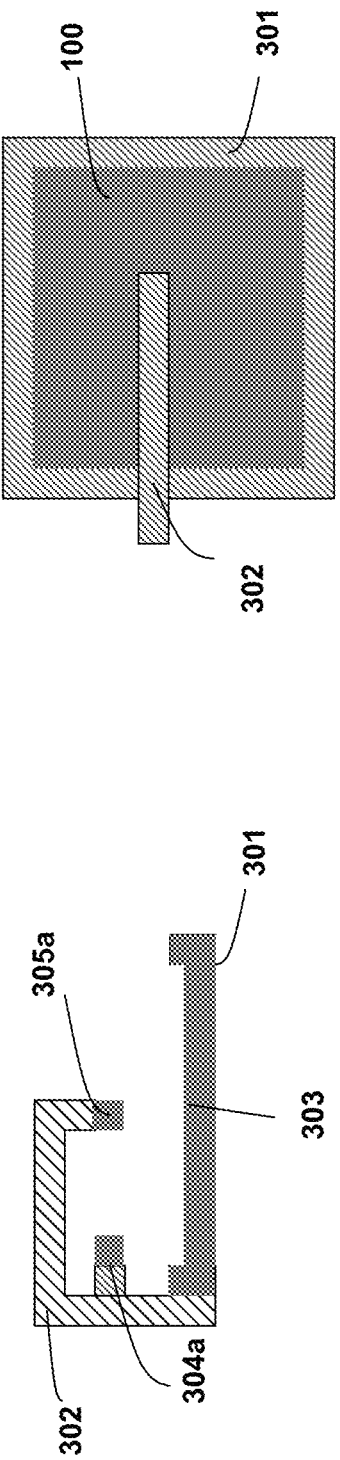
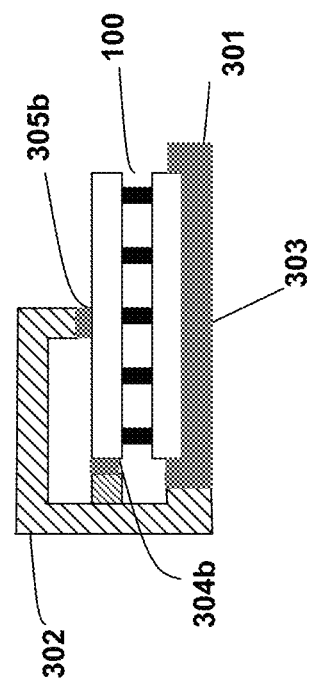
FIG. 3a
FIG. 3b
FIG. 3c

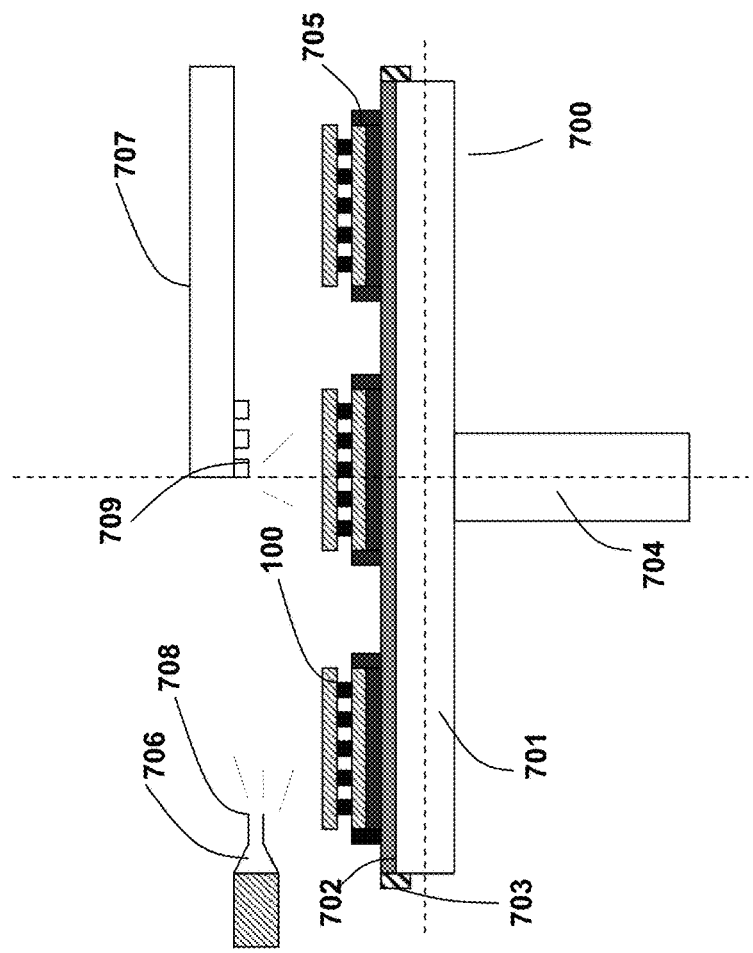
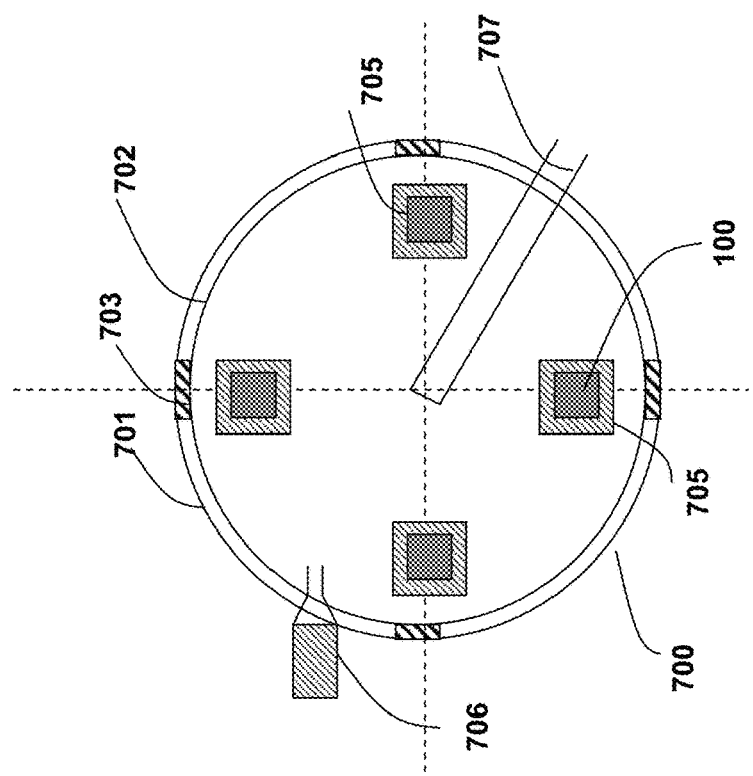
FIG.7b
FIG.7a

METHODS AND APPARATUS FOR CLEANING FLIP CHIP ASSEMBLIES

FIELD OF THE INVENTION

The present invention generally relates to an apparatus and a method for cleaning flip chip assemblies. More particularly, it relates to an apparatus and a method for removing flux residues and other contaminants from flip chips.

BACKGROUND

So-called flip chip assembly is the direct electrical connection of face-down electronic components onto substrates, circuit boards or other carriers, by means of conductive bumps on the chip bond pads. The bumps typically range in diameters from 30-200 microns although larger and smaller sizes are available, and are generally spherical or nearly spherical in shape. Cleaning flip chip assemblies is more complex than cleaning conventional surface mount or through-hole electronic assemblies. In the fabrication of flip chip assemblies, fluxes are frequently employed to join electronic components in soldering process. Various types of fluxes, such as rosin-based fluxes, halogens contained fluxes, are used in this process.

To meet performance and dependability standards, flip-chip assemblies must be free of contamination, such as flux, finger soils, water, or other surface contaminants, otherwise such residue left will lead to ionic contamination and corrosion, and interfere with underfilling to create voids that promote moisture collection, overheating and part failure.

However, there are two significant problems for thoroughly removing the residues: (1) high-temperature during reflow soldering process will create charred and caramelized flux residues that are difficult to be removed; (2) as shrinkage of the bump dimension and pitch continues, the bump structure becomes more fragile and the gap between the bumps and the substrates becomes much smaller, the small and fragile bumps interconnect structure of flip chip assemblies only permits a very narrow space between the chip bond pads to be cleaned, such small gap makes thorough and consistent cleaning of flip chip assemblies a big challenge.

Therefore, there remains a need for an improved flip chip cleaning system that can provide a thorough and uniform cleaning of flux residues and other contaminants.

BRIEF SUMMARY OF THE INVENTION

According to an embodiment of the present invention, an apparatus for cleaning flip chip assemblies is provided. The apparatus comprises: a chuck assembly; a motor that is coupled to the chuck assembly by a spindle; at least one carrier for holding flip chips, each flip chip carrier holds one flip chip. As one aspect of the invention, the flip chip carriers are located on the chuck assembly. As another aspect of the invention, the flip chip carriers are located on a loading plate held by a chuck assembly. As an aspect of the present invention, the flip chip carriers are located off rotation center on the chuck assembly or the loading plate. The distribution pattern of the flip chip carriers may be circle, square, swirl, concentric or any other suitable pattern; at least one spray nozzle for directing DIW (De-ionized Water), a cleaning solution, a gas or a vapor. The flip chips held by flip chip carriers rotate as the chuck assembly spins, during rotation, DIW and/or a cleaning solution sprays onto the center region of the chuck will further spins into the flip chips at the chuck or loading plate peripheral by centrifugal force.

In a first aspect of the invention, an apparatus for cleaning flip chip assemblies further comprises a recess located in the center of the chuck assembly and/or of the flip chip loading plate, the shape of the recess may be round, square or any other suitable pattern; a guide channel connects the recess with each flip chip carrier for facilitating the movement of the liquid from the center recess into the flip chips, during rotation, DIW and/or a cleaning solution sprays onto the center recess will further spins into the flip chips through the guide channel by centrifugal force.

In a second aspect of the invention, an apparatus for cleaning flip chip assemblies further comprises at least one spray nozzle disposed at the side of the flip chip carrier, DIW, a cleaning solutions, a gas or a vapor can be ejected directly into a flip chip from these nozzles.

In a third aspect of the invention, an apparatus for cleaning flip chip assemblies further comprises a recess for holding each carrier, the shape of the recess may be round, square or any other suitable pattern; at least one spray nozzle disposed at the recess edge, DIW, a cleaning solutions, a gas or a vapor can be ejected directly into a flip chip from these nozzles.

In a fourth aspect of the invention, an apparatus for cleaning flip chip assemblies further comprises an outer tank for holding cleaning solution for pre-soaking the flip chips held by the chuck assembly, a liquid circulation loop with a pump located under the tank; at least four outflow ports disposed at the bottom of the tank, from a first outlet extends a drain line and a reclaim line for acid, from a second outlet extends a drain line and a reclaim line for alkali, from a third outlet extends a drain line and a reclaim line for solvent, from a fourth outlet extends a drain line for waste DIW. During process, DIW or a cleaning solution spraying onto the chuck will be stored in the tank until the liquid level immerses the flip chip, long time soaking process can loosen, soften and remove the contaminants, during the soaking process, turning on the pump in the circulation loop, with the activation of the pump, liquid can be circulated continuously in the tank, a high cleaning performance can be obtained by this method.

In a fifth aspect of the invention, an apparatus for cleaning flip chip assemblies further comprises at least one ultrasonic/megasonic device, the ultrasonic/megasonic device operates in the range from 5 KHz to 10 MHz, applying ultrasonic/megasonic energy during cleaning process can enhance the mass transport, reduce the diffusion double layer thickness by forming acoustic streaming layer near reacting surface and by local cavitation bubble implosion. A high cleaning performance can be obtained by the ultrasonic/megasonic agitation. As one aspect of the invention, the ultrasonic/megasonic device is disposed in a position above the flip chip carriers and the chuck assembly. As another aspect of the invention, the ultrasonic/megasonic device is attached on wall of the outer tank.

According to one embodiment of the present invention, a method for cleaning flip chip assemblies is provided. The apparatus comprises: loading at least one flip chip to the flip chip carriers held by a chuck assembly; rotating the chuck assembly at a rotation speed; flowing a liquid (a cleaning solution, DIW, cleaning solution, etc.) for removing the contaminants, the cleaning liquid sprays onto the center region of the chuck will further spins into the flip chips at the chuck and/or loading plate peripheral by centrifugal force; applying ultrasonic/megasonic energy to the flip chips;

blowing a gas or a vapor via the spray nozzles for drying the flip chips; bringing the flip chips out of the flip chip carriers.

In one aspect of the invention, a method for cleaning flip chip assemblies further comprises the steps of changing chuck rotation speed during a cleaning process, in which a low rotation speed and a high rotation speed are used alternatively;

At the beginning of a process, when a liquid is directed on top of the chuck, rotating the chuck assembly at a first lower rotation speed; the liquid is thrown outwards to the chuck periphery by the centrifugal force and further spins into the flip chips held by the flip chip carriers. At low rotation speed, surface tension is the dominant, the liquid tends to slow down and be held in the flip chips without being scattered outward, which permits fully pre-wetting and soaking of the flip chips. Long time soaking can soften and loosen the flux residue and other contaminants adhered to the flip chips; meanwhile, although a low rotational speed creates a thicker boundary layer, it is still sufficiently thin to permit the reactants to diffuse and react with the contaminants.

After the pre-soaking process finishes, stopping supplying the liquid, rotating the chuck at a second higher speed. An increase of the rotation speed results in an increase of the centrifugal force. As the rotation speed increases, the centrifugal force will balance and eventually overcome the surface tension holding the film in the flip chips, which allows the liquid and contaminants trapped therein to be dragged out. Meanwhile, increasing the rotation speed of the chuck assembly can lower the liquid film thickness as well as the diffusion boundary layer of the flip chips surface. As we know, the contaminants removing rate is controlled by the mass transport rate of the chemicals at the solid and liquid interface near the flip chips surface, by Fick's law, reducing the diffusion boundary layer thickness enhances the mass transport rate. So a subsequent high rotation speed allows the cleaning solution fully reacting with the loosed contaminants and thoroughly throwing out the contaminants by centrifugal force.

Repeating the low speed soaking process and high speed throwing out process at least one time, a high cleaning performance can be obtained by this method.

As mentioned above, for a throwing out process, a rotation speed must be high enough to generate a centrifugal force for overcoming the liquid surface tension, and this centrifugal force will cause a centripetal acceleration in the radial direction. According to Newton's second law, we can obtain the following formula:

$$F_c - F_s = ma_c \quad (1)$$

Where $F_c$ denotes centrifugal force, $F_s$ denotes surface tension, m denotes liquid mass, $a_c$ denotes centripetal acceleration.

FIG. 1 depicts an exemplary of flip chip cleaning theory, where B is the length of a flip chip 100, A is the width of a flip chip 100, r is the radius of position of the flip chip carrier 102 on the chuck assembly 101, h is the space between the two chip bond pads. ω is the chuck angular velocity. According to formula 1, the required high rotation speed N can be written as $$N > \frac{60 \times \left(\frac{2\sigma}{\rho h A r} + \frac{2B}{rt^2}\right)^{\frac{1}{2}}}{2\pi} \quad (2)$$

Where t is the chuck spin time, ρ is the liquid density, and σ is the surface tension coefficient.

In the present simulation, assume the chuck spin time t=1 s, the flip chip width A=1 cm, the flip chip length B=1 cm, the flip chip space h=100 um, the flip chip position r=100 mm away from the chuck center.

If the liquid is modeled as DIW and has a density, ρ=1000 kg/m3, and a surface tension coefficient σ=0.0727 N/m at 20 degree C., a second higher speed should be in the range higher than 515 RPM. If the liquid is modeled as ethanol and has a density, ρ=789 kg/m3, and a surface tension coefficient σ=0.0236 N/m at 20 degree C., a second higher speed should be in the range higher than 330 RPM.

BRIEF DESCRIPTION OF THE DRAWINGS

The present invention provides a flip chip cleaning system and a method that can remove the contaminants from a flip chip thoroughly and uniformly. Other objects and features will become apparent from the following detailed description taken in connection with the accompanying drawings. However, the drawings are provided for purpose of illustration only, and are not intended as a definition of the limits of the invention.

FIG. 3a-3c illustrates one exemplary of a flip chip carrier which holds a flip chip in a top fixing manner.

FIG. 7a-7b illustrates an exemplary apparatus for cleaning flip chip assemblies.

DETAILED DESCRIPTION OF EMBODIMENTS

Preferred embodiments of this invention will be described in detail hereinafter with reference to the drawings. The embodiments of the present invention described are not limit the invention to the precise forms disclosed in the following detailed description.

Figure 1:
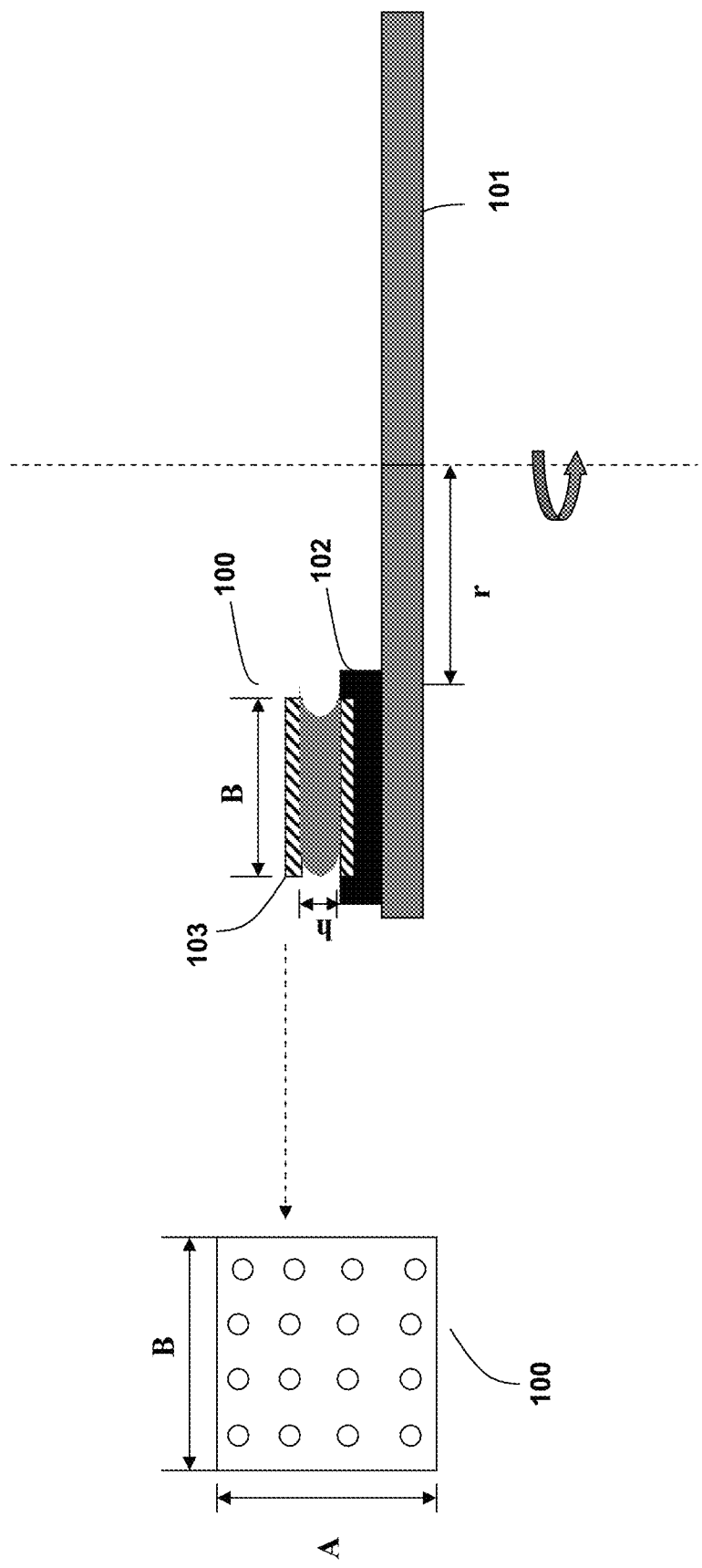
FIG. 1 depicts an exemplary of flip chip cleaning theory.
Figure 2B:
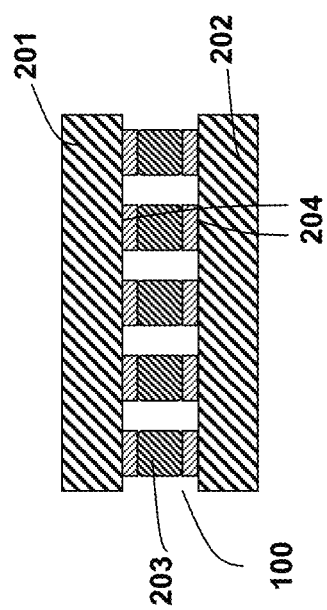
FIG. 2b illustrates a cross-sectional view of the FIG. 2a assembly.
Figure 2A:
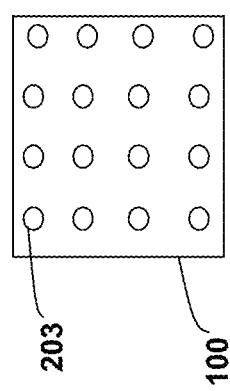
FIG. 2a illustrates a top section view of a flip chip assembly.

FIGS. 2a-2b show top section view and cross-sectional view of a flip chip assembly 100 of a known type, respectively. In some case, the illustrative structure represented in FIGS. 2a-2b is just a part of a flip chip assembly. As depicted, chip 100 including two chip bond pads 201 and 202, which are coupled face-down to each other by an array of solder balls 203. The shape of the pads can be square, rectangular, circular or other shapes depending on specific purpose. During soldering, there will be flux residue or other contaminants 204 that remain on the surface of the solder balls 203 and the surface of the bonding pads 201 and 202. These residues must be cleaned sufficiently, or else it will be left as inclusion in a portion of the solder bump connection, thereby deteriorating an adhesion strength and reliability and further causing a micro-fracture. But, there are significant difficulties for removing all the residues: (1) the high density of disposion of the solder balls 203 leaves a very narrow pitch between successive balls, the small gap between the solder bumps only permits a very closely spaced chip/substrate interface to be cleaned, which makes thorough and consistent cleaning of flip chip assemblies difficult; (2) as shrinkage of the bump dimension continues, the bump structure becomes more and more fragile, which could easily causes damage to these delicate parts during cleaning.

FIGS. 3a-3c shows one exemplary apparatus of a carrier that holds a flip chip in a top fixing manner. As above mentioned, a carrier used for holding a flip chip is located on a chuck assembly or a flip chip loading plate. It has minimum surface so as to allow DIW, a cleaning solution, a gas or a vapor unobstructed access into the flip chip contained. As illustrated in FIGS. 3a-3c, a carrier includes a bottom plate 301 and a top fixing bar 302. The bottom plate includes a groove 303 for holding a flip chip 100. The top fixing bar 302 is rotatable, and includes a middle contacting pole 304 and a top contacting pole 305. The contacting poles may be bounce bumpers or made of flexible materials, which would act as a fixer as well as a safety device during rotation.

For the flip chip carrier mentioned above, a top fixing manner for holding a flip chip is provided, in which a flip chip is loaded into the above mentioned groove 303 in the bottom plate 301; the fixing bar is rotated to the bottom plate direction. As depicted by FIG. 3a, the initial position of the middle contacting pole is 304a and the initial position of the top contacting pole is 305a. Because the two contacting poles are flexible, after a flip chip is loaded, the top contacting pole will be jacked up to the position of 305b; and the middle contacting pole will be pressed at a position 304b. With this apparatus, the flip chip can be fixed well even at a high rotating speed, and the middle contacting pole 304 and a top contacting pole 305 can act as a fixer as well as a safety device during the rotation. After the whole process finishes, the fixing bar will be rotated to the opposite bottom plate direction, and the flip chip will be brought out of the carrier.

Figure 4A:
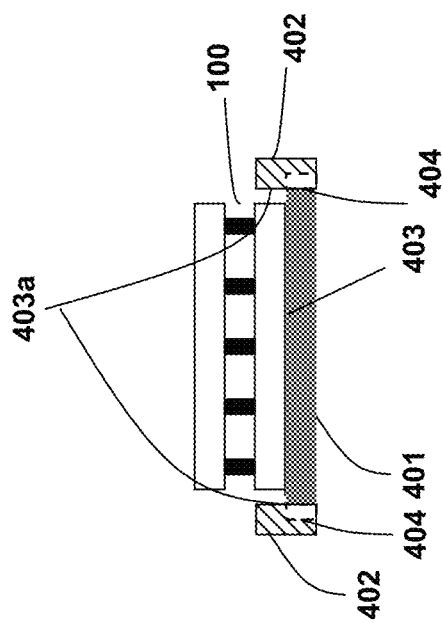
FIG. 4a-4c illustrates another exemplary of a flip chip carrier which holds a flip chip in a bottom fixing manner.
Figure 4B:
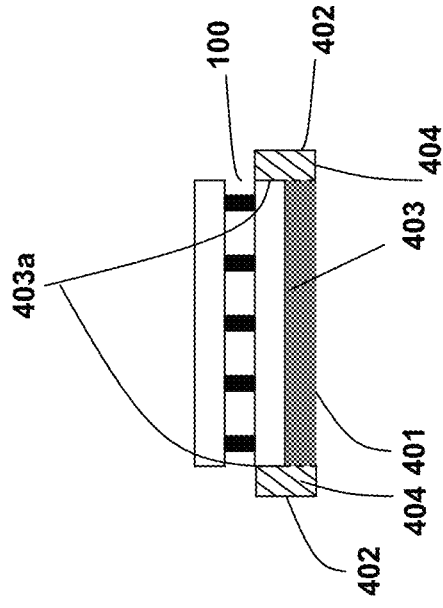
Figure 4C:
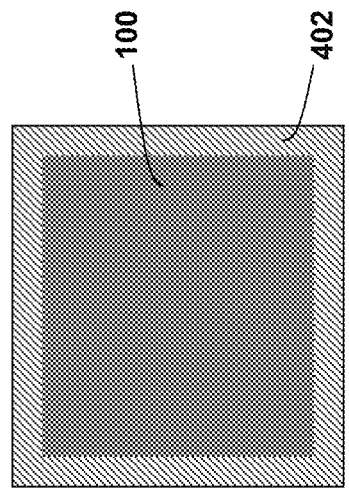

FIG. 4a-4c shows another exemplary apparatus of a carrier that holds a flip chip in a bottom fixing manner. As illustrated in FIGS. 4a-4b, the carrier includes a bottom plate 401 and four bottom side fixing bars 402. The bottom plate includes a groove 403 for holding a flip chip 100, the bottom side fixing bars 402 are push-and-pull rods. There is further a bottom slot 404 in each side fixing bar that can match the groove 403 to be pushed in and pulled out.

For the above flip chip carrier, a bottom fixing manner for holding a flip chip is provided, in which a flip chip 100 is loaded into the above mentioned groove 403 in the bottom plate 401, the initial contacting position with the groove 403 and the bottom slot 404 is 403a; the fixing bars 402 is pushed towards the flip chip direction, the groove 403 will slip into the bottom slots 404 and be firmly seized at the position 403b. With this apparatus, the flip chip can be fixed well even at a high rotating speed. After the whole process finishes, the fixing bar will be pulled opposite to the flip chip direction, and the flip chip will be brought out of the carrier.

Figure 5A:
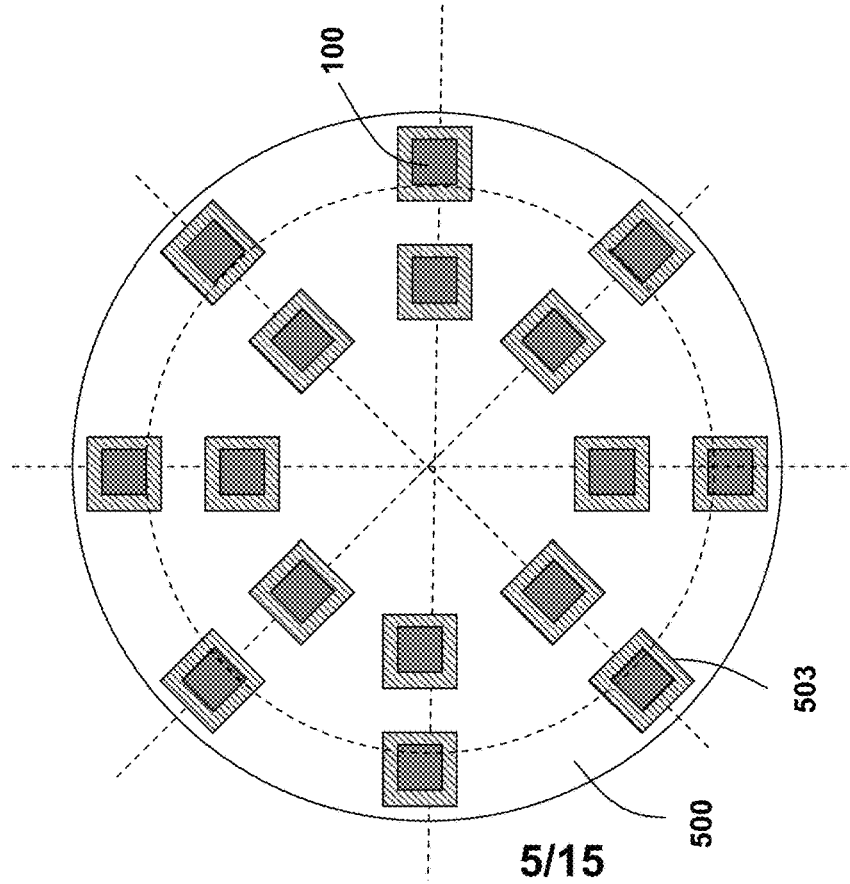
FIG. 5a-5b illustrates a flip chip loading plate assembly.
Figure 5B:
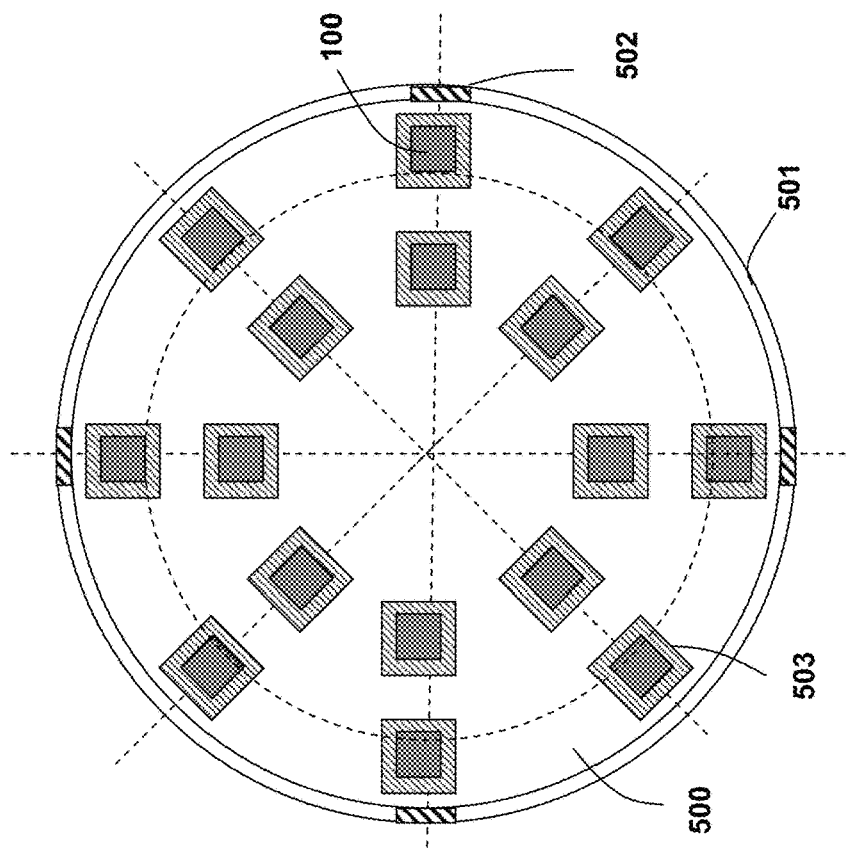

FIG. 5a-5b shows a flip chip loading plate assembly 500. A loading plate holds at least one flip chip carrier 503. Each carrier holds one flip chip 100. The carriers are located off a rotation center on the loading plate. The distribution pattern of the flip chip carriers may be circle, square, swirl, concentric or any other suitable pattern. Before a process beginning, at least one flip chip 100 is pre-loaded into the carriers 503 held by a loading plate; the loading plate is transferred to the process chamber manually or automatically; the loading plate is fixed onto the chuck 501 by several mounting elements 502. As an aspect of the present invention, the flip chip carriers can also be located on the chuck assembly. The carriers are located at the off rotation center on the chuck assembly. The distribution pattern of the flip chip carriers may be circle, square, swirl, concentric or any other suitable pattern.

Figure 6:
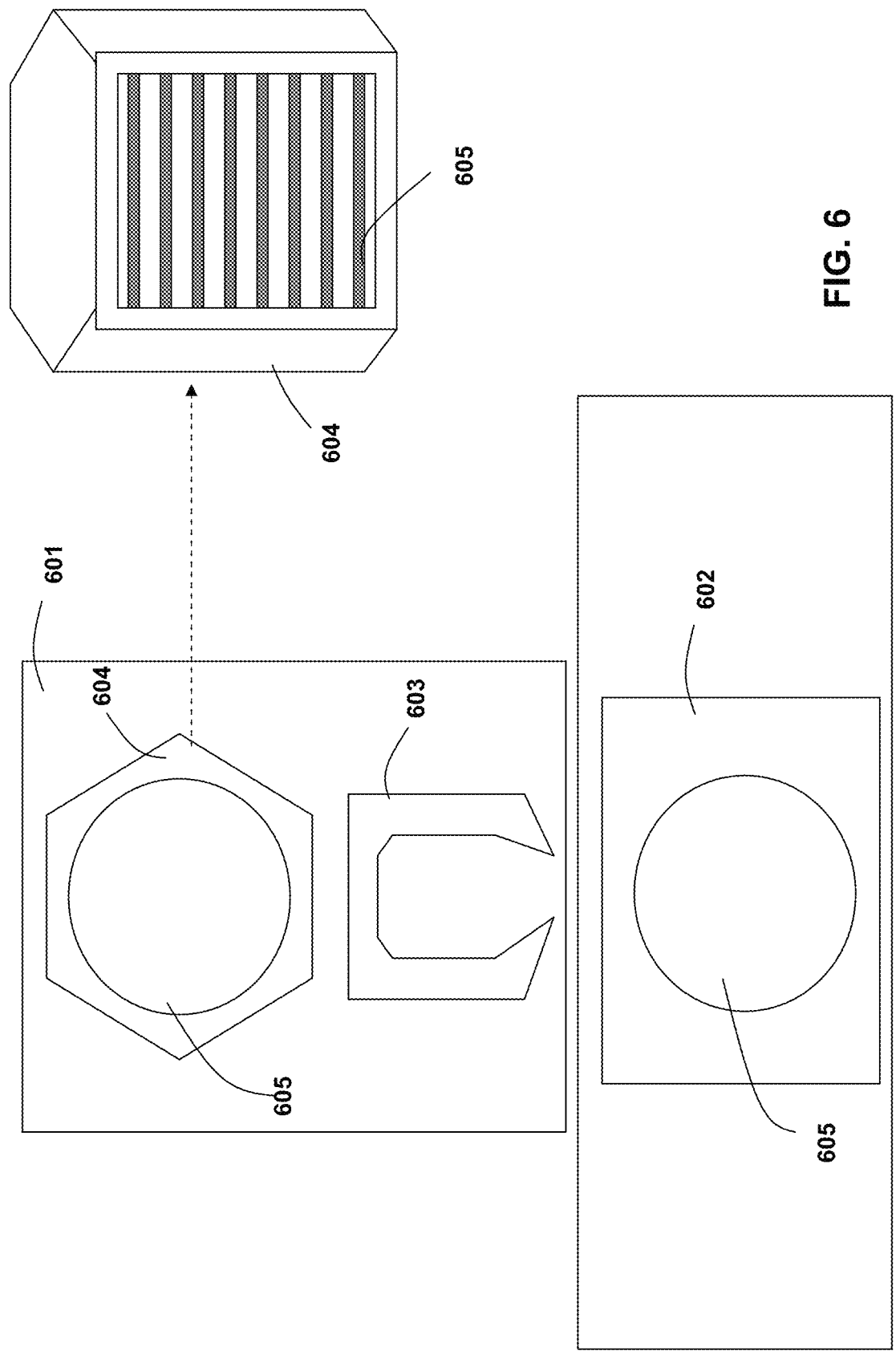
FIG. 6 illustrates a transfer module and a process chamber.

FIG. 6 shows a transfer module 601 and a process chamber 602. The transfer module includes a robot 603 and at least one cassette 604 for holding at least one flip chip loading plate 605 as above mentioned. At least one flip chip is pre-loaded onto the loading plates 605; the plates are placed in the cassette. During the process, the robot 603 transfers a loading plate between the cassette 604 and the process chamber 602. Mass production can be easily realized by this flip chip preloading method.

FIGS. 7a-7b show respective top plan view and cross-sectional view of an exemplary apparatus 700 for cleaning flip chip assemblies. According to the present invention, the apparatus includes: a flip chip loading plate 702 that holds at least one flip chip carrier 705, in which each carrier holds one flip chip 100, the loading plate 702 is fixed on the chuck 701 by several mounting elements 703; a motor (not shown in the figures) is coupled to the chuck assembly by a spindle 704. The apparatus further includes at least one spray nozzle for directing DIW, a cleaning solution, a gas or a vapor. The spray nozzle can be a fix nozzle 706, a scan nozzle or a swing nozzle 707. The number and arrangement of the spray nozzles is varied depending on actual requirements. The flip chips 100 held by the flip chip carriers 705 rotate as the chuck assembly 701 spins. During rotation, DIW or a cleaning solution spraying onto the center of the loading plate 702 will further spins into the flip chips 100 held by flip chip carriers 705 at the outer periphery of the loading plate 702 due to centrifugal force.

According to the embodiments mentioned above, a method for cleaning flip chip assemblies can be set as follows:

Process Sequence

Step 1: Loading at least one flip chip 100 to a flip chip carrier 705 held by a loading plate 702;

Step 2: Placing the loading plate into a cassette;

Step 3: Transferring the loading plate 702 from a cassette into the process chamber 700;

Step 4: Rotating the chuck assembly 701 at a first lower speed from 10 to 500 rpm;

Step 5: Flowing DIW onto the loading plate 702 with a flowrate from 0.5 LPM to 5 LPM, preferably from 1.5 LPM to 3 LPM, the liquid will further spins into the flip chips 100 due to centrifugal force, the process time ranges from 20 to 300 s;

Step 6: Stopping supplying DIW;

Step 7: Supplying a cleaning solution onto the loading plate 702 at the first lower rotation speed with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent. The liquid will further spin into the flip chips 100 by centrifugal force, this process time can range from 20 to 300 s;

Step 8: Continuously supplying the cleaning solution, rotating the chuck assembly at a second higher speed that ranges from 500 to 2000 rpm, this process time can range from 20 to 100 s;

Step 9: Repeating step 7 and step 8 at least one time;

Step 10: Repeating step 5;

Step 11: Rotating the chuck assembly at a predefined high speed range from 1000 to 3000 rpm;

Step 12: Blowing a gas or a vapor for drying the flip chips with a flowrate from 1 slm to 10 slm, preferably from 4 slm to 6 slm, this process time can range from 20 to 200 s;

Step 13: Transferring the loading plate out of the process chamber 700 back to the cassette;

Step 14: Bringing the flip chips out of the loading plate.

Although the present invention has been described with respect to certain embodiments, examples, and applications, it will be apparent to those skilled in the art that various modifications and changes may be made without departing from the invention.

Figures 8A, 8B:
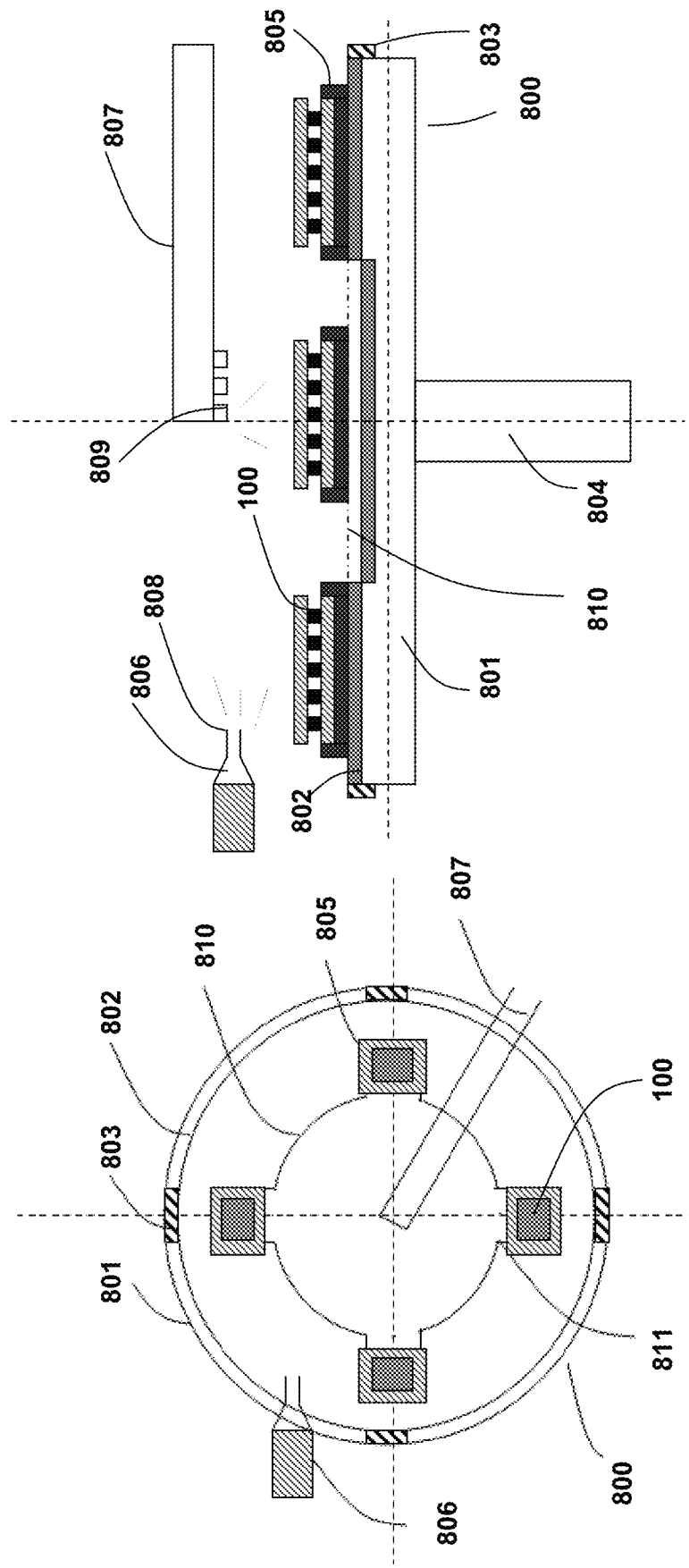
FIG. 8a-8b illustrates another exemplary apparatus for cleaning flip chip assemblies.

FIGS. 8*a*-8*b* show top plan view and cross-sectional view of another exemplary apparatus 800 for cleaning flip chip assemblies, respectively. According to the present invention, the apparatus includes: a flip chip loading plate 802 that holds at least one flip chip carrier 805, in which each carrier holds one flip chip 100, the loading plate 802 is fixed on the chuck 801 by several mounting elements 803; a recess 810 that located in the center of the loading plate 802 and of the chuck 801, the shape of the recess may be round, square or any other suitable pattern; a guide channel 811 that connects the recess with each flip chip carrier for facilitating the movement of the liquid from the center recess into the flip chips; a motor that (not shown in the figures) is coupled to the chuck assembly by a spindle 804. The apparatus further includes at least one spray nozzle for directing DIW, a cleaning solution, a gas or a vapor. The spray nozzle can be a fix nozzle 806, a scan nozzle or a swing nozzle 807. The number and arrangement of the spray nozzles are varied depending on actual requirements. The flip chips 100 held by the flip chip carriers 805 rotate as the chuck 801 spins. During the rotation, DIW or a cleaning solution spraying onto the center recess 810 of the loading plate will further spins into the flip chips 100 held by flip chip carriers 805 at the outer periphery of the loading plate 802 through the guide channel 811 due to centrifugal force.

According to the embodiment mentioned above, a method for cleaning flip chip assemblies can be set as follows:

Process Sequence

Step 1: Loading at least one flip chip 100 into a flip chip carrier 805 held by a loading plate 802;

Step 2: Placing the loading plate into a cassette;

Step 3: Transferring the loading plate 802 from a cassette into the process chamber 800;

Step 4: Rotating the chuck assembly 801 at a first lower speed from 10 to 500 rpm;

Step 5: Flowing DIW to the center recess 810 with a flowrate from 0.5 LPM to 5 LPM, preferably from 1.5 LPM to 3 LPM, the liquid will further spins into the flip chips 100 through the guide channel 811 by centrifugal force, the process time ranges from 20 to 300 s;

Step 6: Stopping supplying DIW;

Step 7: Supplying a cleaning solution to the center recess 810 at the first lower speed with a flowrate from 0.5 LPM to 5 LPM, preferably from 1.5 LPM to 3 LPM, the cleaning solution may be chlorofluorocarbons solvent, Hydrocarbon solvents or chlorinated solvents. The liquid will further spin into the flip chips 100 through the guide channel 811 by centrifugal force, this process time can range from 20 to 300 s;

Step 8: Continuously supplying the cleaning solution, rotating the chuck assembly at a second higher speed range from 500 to 2000 rpm, this process time can range from 20 to 100 s;

Step 9: Repeating step 7 and step 8 at least one time;

Step 10: Repeating step 5;

Step 11: Rotating the chuck assembly ay a predefined high speed range from 1000 to 3000 rpm;

Step 12: Blowing a gas or a vapor for drying the flip chips with a flowrate from 1 slm to 10 slm, preferably from 4 slm to 6 slm, this process time can range from 20 to 200 s;

Step 13: Transferring the loading plate out of the process chamber 800 back to the cassette;

Step 14: Bringing the flip chips out of the loading plate.

Although the present invention has been described with respect to certain embodiments, examples, and applications, it will be apparent to those skilled in the art that various modifications and changes may be made without departing from the invention.

Figure 9:
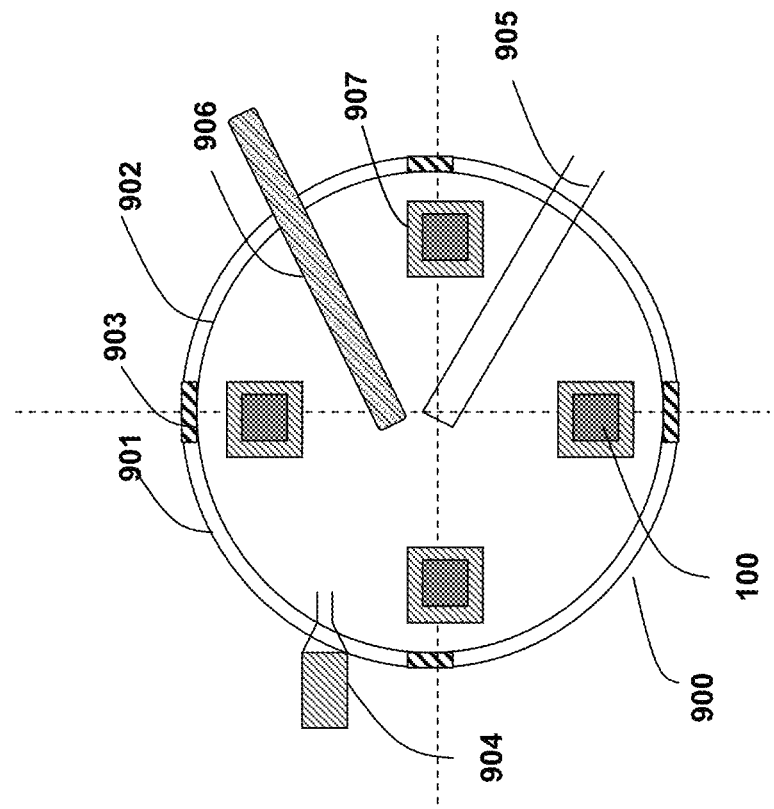
FIG. 9 illustrates another exemplary apparatus for cleaning flip chip assemblies.

FIG. 9 shows a top plan view of another exemplary apparatus 900 for cleaning flip chip assemblies. According to the present invention, the apparatus includes: a flip chip loading plate 902 that holds at least one flip chip 100, the loading plate 902 is fixed on the chuck 901 by several mounting elements 903; a motor (not shown in the figure) is coupled to the chuck assembly by a spindle (not shown in the figure); at least one ultrasonic/megasonic device 906 disposed in a position above the flip chip carriers and the chuck assembly, the ultrasonic/megasonic device is operated in the range of 5 KHz to 10 MHz. The apparatus further includes at least one spray nozzle for directing DIW, a cleaning solution, a gas or a vapor. The spray nozzle can be a fix nozzle 904, a scan nozzle or a swing nozzle 905, or be assembled in an ultrasonic/megasonic device 906. The number and arrangement of the spray nozzles are varied depending on actual requirements. The loading plate 902 rotates as the chuck 901 spins. During rotation, DIW or a cleaning solution spraying onto loading plate will further spins into the flip chips 100 by centrifugal force.

According to the embodiment mentioned above, a method for cleaning flip chip assemblies can be set as follows:

Process Sequence

Step 1: Loading at least one flip chip 100 into a flip chip carrier 907 held by a loading plate 902;

Step 2: Placing the loading plate 902 into a cassette;

Step 3: Transferring the loading plate 902 into the process chamber 900;

Step 4: Rotating the chuck assembly 901 at a first lower speed that ranges from 10 to 500 rpm;

Step 5: Flowing DIW to the loading plate 902 with a flowrate from 0.5 LPM to 5 LPM, preferably from 1.5 LPM to 3 LPM, the liquid will further spins into the flip chips 100 by centrifugal force, the process time ranges from 20 to 300 s;

Step 6: Stopping supplying DIW;

Step 7: Supplying a cleaning solution onto the loading plate 902 at the first lower speed with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent. The liquid will further spin into the flip chips 100 by centrifugal force;

Step 8: Turning on ultrasonic/megasonic device at a operating frequency from 5 KHz to 10 MHz, preferably from 1 MHz to 3 MHz. Make sure the liquid level can cover the lower surface of the ultrasonic/megasonic device. This process time can range from 20 to 300 s;

Step 9: Turning off ultrasonic/megasonic device, continuously supplying the cleaning solution, rotating the chuck assembly at a second higher speed range from 500 to 2000 rpm, this process time can range from 20 to 100 s;

Step 10: Repeating step 7 to step 9 at least one time;

Step 11: Repeating step 5;

Step 12: Rotating the chuck assembly at a predefined high speed that ranges from 1000 to 3000 rpm;

Step 13: Blowing a gas or a vapor for drying the flip chips with a flowrate from 1 slm to 10 slm, preferably from 4 slm to 6 slm, this process time can ranges from 20 to 200 s;

Step 14: Transferring the loading plate out of the process chamber 900 back to the cassette;

Step 15: Bringing the flip chips out of the loading plate.

Although the present invention has been described with respect to certain embodiments, examples, and applications, it will be apparent to those skilled in the art that various modifications and changes may be made without departing from the invention.

Figure 10:
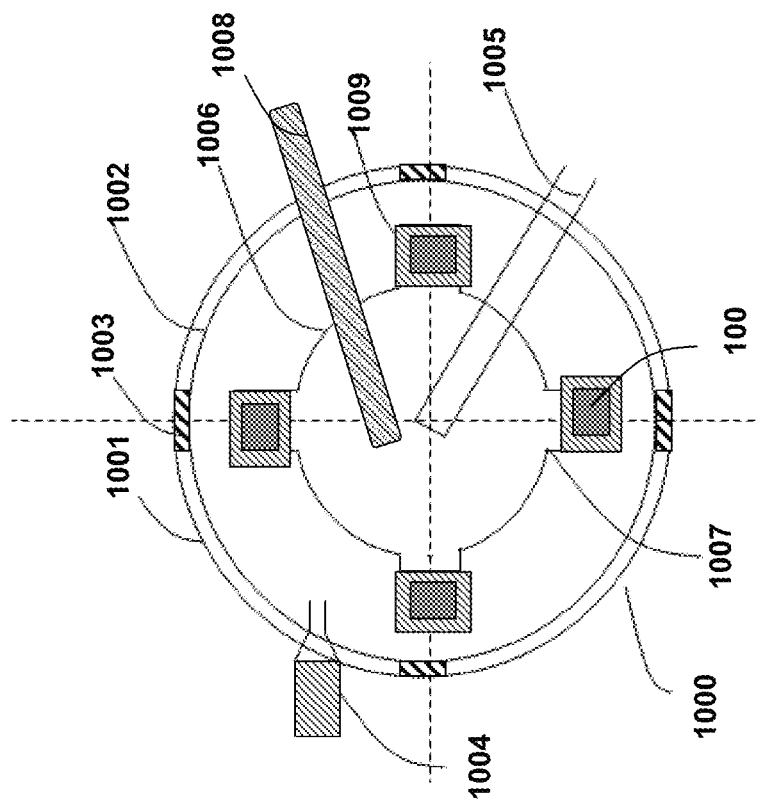
FIG. 10 illustrates another exemplary apparatus for cleaning flip chip assemblies.

FIG. 10 shows a top plan view of another exemplary apparatus 1000 for cleaning flip chip assemblies. According to the present invention, the apparatus includes: a flip chip loading plate 1002 that holds at least one flip chip 100, the loading plate 1002 is fixed on the chuck 1001 by several mounting elements 1003; a recess 1006 located in the center of the loading plate 1002 and of the chuck assembly 1001, the shape of the recess may be round, square or any other suitable pattern; a guide channel 1007 that connects the recess with each flip chip carrier for facilitating the movement of the liquid from the center recess into the flip chips; a motor (not shown in the figure) that is coupled to the chuck assembly by a spindle (not shown in the figure); at least one ultrasonic/megasonic device 1008 disposed in a position above the flip chip carriers and the chuck assembly, the ultrasonic/megasonic device operates in the range of 5 KHz to 10 MHz. The apparatus further includes at least one spray nozzle for directing DIW, a cleaning solution, a gas or a vapor. The spray nozzle can be a fix nozzle 1004, a scan nozzle or a swing nozzle 1005, or be assembled in an ultrasonic/megasonic device 1008. The number and arrangement of the spray nozzles are varied depending on actual requirements. The flip chips 100 rotate as the chuck 1001 spins. During the rotation, DIW or a cleaning solution spraying onto the center recess 1006 of the loading plate will further spins into the flip chips 100 held by flip chip carriers 1009 at the loading plate outer periphery through the guide channel 1007 by centrifugal force.

According to the embodiment mentioned above, a method for cleaning flip chip assemblies can be set as follows:

Process Sequence

Step 1: Loading at least one flip chip 100 into the flip chip carriers 1009 held by a loading plate 1002;

Step 2: Placing the loading plate 1002 into a cassette;

Step 3: Transferring the loading plate 1002 into the process chamber 1000;

Step 4: Rotating the chuck assembly 1001 at a first lower speed that ranges from 10 to 500 rpm;

Step 5: Flowing DIW to the center recess 1006 with a flowrate from 0.5 LPM to 5 LPM, preferably from 1.5 LPM to 3 LPM, the liquid will further spins into the flip chips 100 through the guide channel 1007 by centrifugal force, the process time ranges from 20 to 300 s;

Step 6: Stopping supplying DIW;

Step 7: Supplying a cleaning solution to the center recess 1006 at the first lower speed with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent. The liquid will further spin into the flip chips 100 through the guide channel 1007 by centrifugal force.

Step 8: Turning on ultrasonic/megasonic device at a operating frequency from 5 KHz to 10 MHz, preferably from 1 MHz to 3 MHz. Make sure the liquid level can cover the lower surface of the ultrasonic/megasonic device. This process time can range from 20 to 300 s;

Step 9: Turning off ultrasonic/megasonic device, continuously supplying the cleaning solution, rotating the chuck assembly at a second higher speed range from 500 to 2000 rpm, this process time can range from 20 to 100 s;

Step 10: Repeating step 7 to step 9 at least one time;

Step 11: Repeating step 5;

Step 12: Rotating the chuck assembly at a predefined high speed that ranges from 1000 to 3000 rpm, Step 13: Blowing a gas or a vapor for drying the flip chips with a flowrate from 1 slm to 10 slm, preferably from 4 slm to 6 slm, this process time can range from 20 to 200 s;

Step 14: Transferring the loading plate out of the process chamber 1000 back to the cassette;

Step 15: Bringing the flip chips out of the loading plate.

Although the present invention has been described with respect to certain embodiments, examples, and applications, it will be apparent to those skilled in the art that various modifications and changes may be made without departing from the invention.

Figure 11:
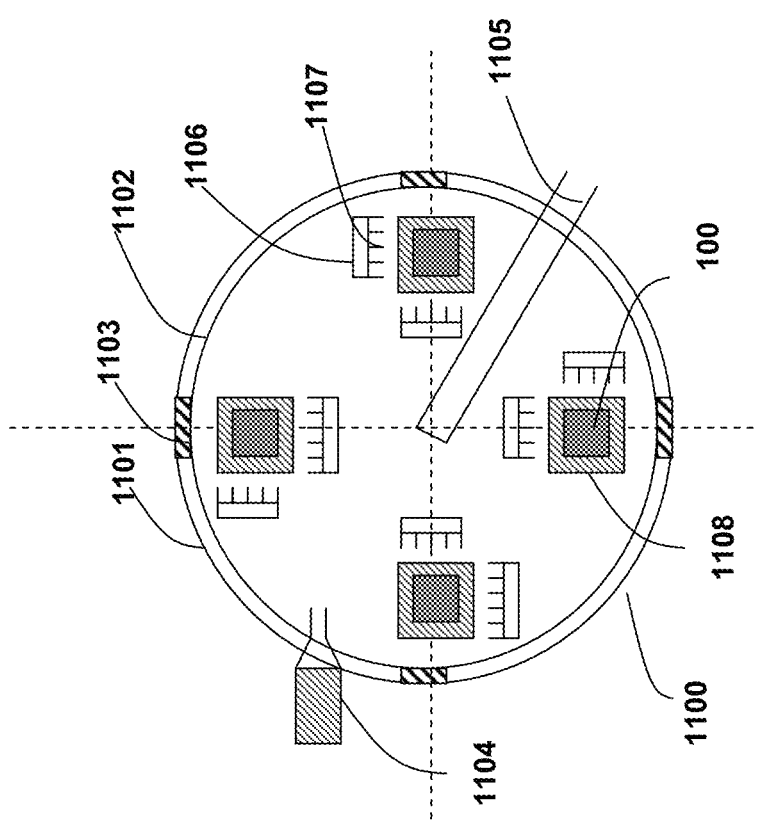
FIG. 11 illustrates another exemplary apparatus for cleaning flip chip assemblies.

FIG. 11 shows a top plan view of another exemplary apparatus 1100 for cleaning flip chip assemblies. According to the present invention, the apparatus includes: a flip chip loading plate 1102 that holds at least one flip chip 100, the loading plate 1102 is fixed on the chuck 1101 by several mounting elements 1103; a motor (not shown in the figure) that is coupled to the chuck assembly by a spindle (not shown in the fig); at least one spray nozzle 1106 at the side of each flip chip carrier, where a plurality of ejecting nozzles 1107 linearly disposed parallel to each other, during process, liquid or gas can be ejected into the flip chips from these nozzles. The apparatus further includes at least another type of spray nozzles for directing DIW, a cleaning solution, a gas or a vapor. The spray nozzle can be a fix nozzle 1104, a scan nozzle or a swing nozzle 1105. The number and arrangement of the spray nozzles can be varied depending on actual requirements. The loading plate 1102 rotates as the chuck 1101 spins. During the rotation, DIW or a cleaning solution spraying onto loading plate will further spins into the flip chips 100 due to centrifugal force.

According to the embodiment mentioned above, a method for cleaning flip chip assemblies can be set as follows:

Process Sequence

Step 1: Loading at least one flip chip 100 into the flip chip carriers 1108 held by a loading plate 1102;

Step 2: Placing the loading plate 1102 into a cassette;

Step 3: Transferring the loading plate 1102 into the process chamber 1100;

Step 4: Rotating the chuck assembly 1101 at a first lower speed that ranges from 10 to 500 rpm;

Step 5: Spraying DIW directly into the flip chips 100 from the ejecting nozzles 1107 at the carrier side with a flowrate from 0.5 LPM to 3 LPM, preferably from 1 LPM to 2 LPM, supplying DIW to the loading plate 1102 via a fix nozzle 1104, and/or a scan/swing nozzle 1105 with a flowrate from 0.5 LPM to 5 LPM, preferably from 1.5 LPM to 3 LPM, the liquid will further spins into the flip chips 100 by centrifugal force, the process time ranges from 20 to 300 s;

Step 6: Stopping supplying DIW;

Step 7: Spraying a cleaning solution directly into the flip chips 100 from the ejecting nozzles 1107 at the carrier side with a flowrate from 0.5 LPM to 3 LPM, preferably from 1 LPM to 2 LPM, supplying the cleaning solution to the loading plate 1102 from a fix nozzle 1104, and/or a scan/swing nozzle 1105 with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent, the liquid will further spins into the flip chips 100 by centrifugal force, this process time can range from 20 to 300 s;

Step 8: Continuously supplying the cleaning solution, rotating the chuck assembly at a second higher speed that ranges from 500 to 2000 rpm, this process time can range from 20 to 100 s;

Step 9: Repeating step 7 and step 8 at least one time;

Step 10: Repeating step 5;

Step 11: Rotating the chuck assembly at a predefined high speed that ranges from 1000 to 3000 rpm, Step 12: Blowing a gas or a vapor for drying the flip chips with a flowrate from 1 slm to 10 slm, preferably from 4 slm to 6 slm, this process time can range from 20 to 200 s;

Step 13: Transferring the loading plate out of the process chamber 1100 back to the cassette;

Step 14: Bringing the flip chips out of the loading plate.

Although the present invention has been described with respect to certain embodiments, examples, and applications, it will be apparent to those skilled in the art that various modifications and changes may be made without departing from the invention.

Figure 12:
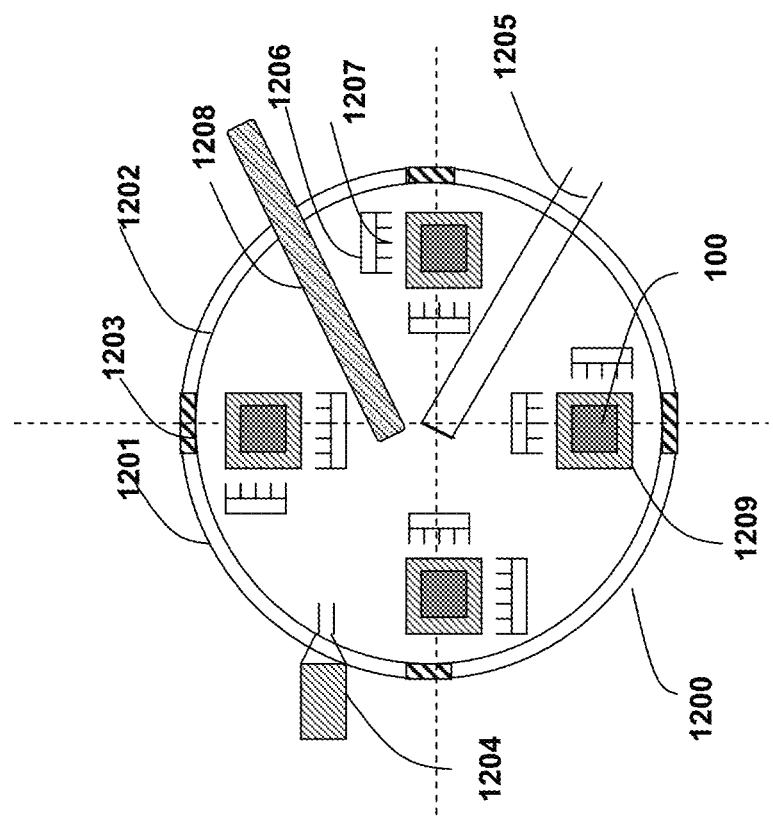
FIG. 12 illustrates another exemplary apparatus for cleaning flip chip assemblies.

FIG. 12 shows a top plan view of another exemplary apparatus 1200 for cleaning flip chip assemblies. According to the present invention, the apparatus includes: a flip chip loading plate 1202 that holds at least one flip chip 100 held by the flip chip carriers 1209, the loading plate 1202 is fixed on the chuck 1201 by several mounting elements 1203; a motor (not shown in the figure) that is coupled to the chuck assembly by a spindle (not shown in the figure); at least one ultrasonic/megasonic device 1208 disposed in a position above the flip chip carriers and the chuck assembly, the ultrasonic/megasonic device is operated in the range from 5 KHz to 10 MHz; at least one spray nozzle 1206 at the side of each flip chip carrier, where a plurality of ejecting nozzles 1207 linearly disposed parallel to each other, liquid or gas can be ejected into the flip chips from these nozzles. The apparatus further includes at least another type of spray nozzles for directing DIW, a cleaning solution, a gas or a vapor. The spray nozzle can be a fix nozzle 1204, a scan nozzle or a swing nozzle 1205, or be assembled in an ultrasonic/megasonic device 1208. The number and arrangement of the spray nozzles are varied depending on actual requirements. The flip chips 1202 rotate as the chuck 1201 spins. During the rotation, DIW or a cleaning solution spraying onto the center of the loading plate will further spin into the flip chips 100 held by the flip chip carriers 1209 at the loading plate outer periphery by centrifugal force.

According to the embodiment mentioned above, a method for cleaning flip chip assemblies can be set as follows:

Process Sequence

Step 1: Loading at least one flip chip 100 into the flip chip carriers 1209 held by a loading plate 1202;

Step 2: Placing the loading plate 1202 into a cassette;

Step 3: Transferring the loading plate 1202 into the process chamber 1200;

Step 4: Rotating the chuck assembly 1201 at a first lower speed that ranges from 10 to 500 rpm;

Step 5: Spraying DIW directly into the flip chips 100 from the ejecting nozzles 1207 at the carrier side with a flowrate from 0.5 LPM to 3 LPM, preferably from 1 LPM to 2 LPM, supplying DIW to the loading plate 1202 via a fix nozzle 1204, and/or a scan/swing nozzle 1205 with a flowrate from 0.5 LPM to 5 LPM, preferably from 1.5 LPM to 3 LPM, the liquid will further spins into the flip chips 100 by centrifugal force, the process time ranges from 20 to 300 s;

Step 6: Stopping supplying DIW;

Step 7: Spraying a cleaning solution directly into the flip chips 100 from the ejecting nozzles 1207 at the carrier side with a flowrate from 0.5 LPM to 3 LPM, preferably from 1 LPM to 2 LPM, supplying the cleaning solution to the loading plate 1202 via a fix nozzle 1204, and/or a scan/swing nozzle 1205 with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent. The liquid will further spins into the flip chips 100 by centrifugal force;

Step 8: Turning on ultrasonic/megasonic device at an operating frequency from 5 KHz to 10 MHz, preferably from 1 MHz to 3 MHz. Make sure the liquid level can cover the lower surface of the ultrasonic/megasonic device, this process time can range from 20 to 300 s;

Step 9: Turning off ultrasonic/megasonic device, continuously supplying the cleaning solution, rotating the chuck assembly at a second higher speed range from 500 to 2000 rpm, this process time can range from 20 to 100 s;

Step 10: Repeating step 7 to step 9 at least one time;

Step 11: Repeating step 5;

Step 12: Rotating the chuck assembly at a predefined high speed that ranges from 1000 to 3000 rpm, Step 13: Blowing a gas or a vapor for drying the flip chips with a flowrate from 1 slm to 10 slm, preferably from 4 slm to 6 slm, this process time can be ranged from 20 to 200 s;

Step 14: Transferring the loading plate out of the process chamber 1200 back to the cassette;

Step 15: Bringing the flip chips out of the loading plate.

Although the present invention has been described with respect to certain embodiments, examples, and applications, it will be apparent to those skilled in the art that various modifications and changes may be made without departing from the invention.

Figure 13:
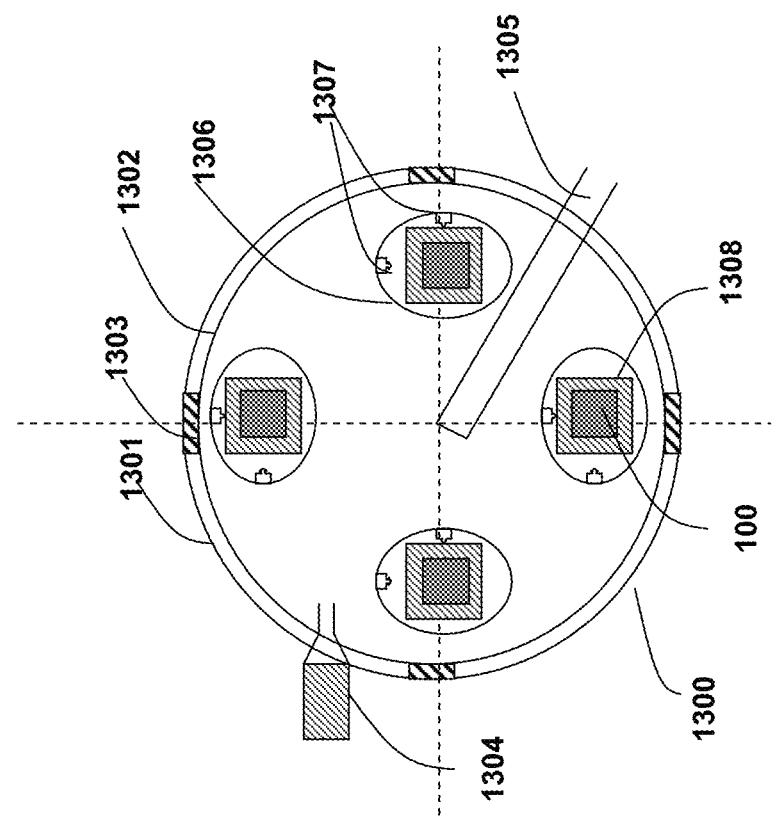
FIG. 13 illustrates another exemplary apparatus for cleaning flip chip assemblies.

FIG. 13 shows a top plan view of another exemplary apparatus 1300 for cleaning flip chip assemblies. According to the present invention, the apparatus includes: a flip chip loading plate 1302 that holds at least one flip chip carrier, each carrier holds one flip chip 100, a recess 1306 that is configured for holding each carrier; at least one spray nozzle 1307 disposed at the recess edge, during process, liquid or gas can be ejected into the flip chips from these nozzles; the loading plate 1302 is fixed on the chuck 1301 by several mounting elements 1303; a motor (not shown in the figure) that is coupled to the chuck assembly by a spindle (not shown in the figure). The apparatus further includes at least one spray nozzle for directing DIW, a cleaning solution, a gas or a vapor. The spray nozzle can be a fix nozzle 1304, a scan nozzle or a swing nozzle 1305. The number and arrangement of the spray nozzles are varied depending on actual requirements. The loading plate 1302 rotates as the chuck 1301 spins. During the rotation, DIW or a cleaning solution spraying onto loading plate will further spin into the flip chips 100 held by the flip chip carriers 1308 by centrifugal force.

According to the embodiment mentioned above, a method for cleaning flip chip assemblies can be set as follows:

Process Sequence

Step 1: Loading at least one flip chip 100 into the flip chip carriers 1308 held by a loading plate 1302;

Step 2: Placing the loading plate 1302 into a cassette;

Step 3: Transferring the loading plate 1302 into the process chamber 1300;

Step 3: Rotating the chuck assembly 1301 at a first lower speed that ranges from 10 to 500 rpm;

Step 5: Spraying DIW directly into the flip chips 100 from the ejecting nozzles 1307 at the recess with a flowrate from 0.5 LPM to 3 LPM, preferably from 1 LPM to 2 LPM, supplying DIW to the loading plate 1302 via a fix nozzle 1304, and/or a scan/swing nozzle 1305 with a flowrate from 0.5 LPM to 5 LPM, preferably from 1.5 LPM to 3 LPM, the liquid will further spins into the flip chips 100 by centrifugal force, the process time ranges from 20 to 300 s;

Step 6: Stopping supplying DIW;

Step 7: Spraying a cleaning solution directly into the flip chips 100 from the ejecting nozzles 1307 at the edge of the recess with a flowrate from 0.5 LPM to 3 LPM, preferably from 1 LPM to 2 LPM, supplying the cleaning solution to the loading plate 1302 via a fix nozzle 904, and/or a scan/swing nozzle 1305 with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent. The liquid will further spin into the flip chips 100 by centrifugal force, this process time can range from 20 to 300 s;

Step 8: Continuously supplying the cleaning solution, rotating the chuck assembly at a second higher speed that ranges from 500 to 2000 rpm, this process time can range from 20 to 100 s;

Step 9: Repeating step 7 and step 8 at least one time;

Step 10: Repeating step 5;

Step 11: Rotating the chuck assembly at a predefined high speed that ranges from 1000 to 3000 rpm, Step 12: Blowing a gas or a vapor for drying the flip chips with a flowrate from 1 slm to 10 slm, preferably from 4 slm to 6 slm, this process time can range from 20 to 200 s;

Step 13: Transferring the loading plate out of the process chamber 1300 back to the cassette;

Step 14: Bringing the flip chips out of the loading plate.

Although the present invention has been described with respect to certain embodiments, examples, and applications, it will be apparent to those skilled in the art that various modifications and changes may be made without departing from the invention.

Figure 14:
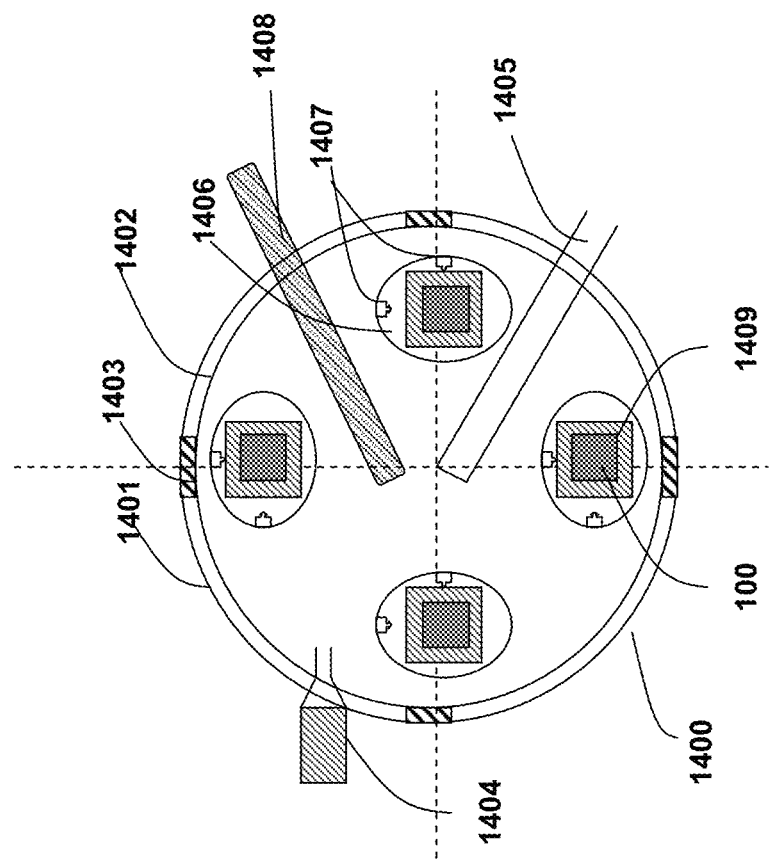
FIG. 14 illustrates another exemplary apparatus for cleaning flip chip assemblies.

FIG. 14 shows a top plan view of another exemplary apparatus 1400 for cleaning flip chip assemblies. According to the present invention, the apparatus includes: a flip chip loading plate 1402 that holds at least one flip chip carrier, each carrier holds one flip chip 100, a recess 1406 that is configured for containing each carrier; at least one spray nozzle 1407 disposed at the recess edge, during process, liquid or gas can be ejected into the flip chips from these nozzles; the loading plate 1402 is fixed on the chuck 1401 by several mounting elements 1403; a motor (not shown in the figure) that is coupled to the chuck assembly by a spindle (not shown in the figure); at least one ultrasonic/megasonic device 1408 disposed in a position above the flip chip carriers and the chuck assembly, the ultrasonic/megasonic device is operated in the range from 5 KHz to 10 MHz. The apparatus further includes at least one spray nozzle for directing DIW, a cleaning solution, a gas or a vapor. The spray nozzle can be a fix nozzle 1404, a scan nozzle or a swing nozzle 1405, or be assembled in an ultrasonic/megasonic device 1408. The number and arrangement of the spray nozzles are varied depending on actual requirements. The loading plate 1402 rotates as the chuck 1401 spins. During the rotation, DIW or a cleaning solution spraying onto the center of the loading plate will further spin into the flip chips 100 held by the flip chip carriers 1409 at the loading plate outer periphery by centrifugal force.

According to the embodiment mentioned above, a method for cleaning flip chip assemblies can be set as follows:

Process Sequence

Step 1: Loading at least one flip chip 100 into the flip chip carriers 1409 held by a loading plate 1402;

Step 2: Placing the loading plate 1402 into a cassette;

Step 3: Transferring the loading plate 1402 into the process chamber 1400;

Step 4: Rotating the chuck assembly 1401 at a first lower speed that ranges from 10 to 500 rpm;

Step 5: Spraying DIW directly into the flip chips 100 from the ejecting nozzles 1407 at the edge of the recess with a flowrate from 0.5 LPM to 3 LPM, preferably from 1 LPM to 2 LPM, supplying DIW to the loading plate 1402 via a fix nozzle 1404, and/or a scan/swing nozzle 1405 with a flowrate from 0.5 LPM to 5 LPM, preferably from 1.5 LPM to 3 LPM, the liquid will further spin into the flip chips 100 by centrifugal force, the process time ranges from 20 to 300 s;

Step 6: Stopping supplying DIW;

Step 7: Spraying a cleaning solution directly into the flip chips 100 from the ejecting nozzles 1407 at the edge of the recess with a flowrate from 0.5 LPM to 3 LPM, preferably from 1 LPM to 2 LPM, supplying the cleaning solution to the loading plate 1402 via a fix nozzle 1404, and/or a scan/swing nozzle 1405 with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent. The liquid will further spin into the flip chips 100 by centrifugal force;

Step 8: Turning on ultrasonic/megasonic device at a operating frequency from 5 KHz to 10 MHz, preferably from 1 MHz to 3 MHz. Make sure the liquid level can cover the lower surface of the ultrasonic/megasonic device. This process time can ranges from 20 to 300 s;

Step 9: Turning off ultrasonic/megasonic device, continuously supplying the cleaning solution, rotating the chuck assembly at a second higher speed that ranges from 500 to 2000 rpm, this process time can range from 20 to 100 s;

Step 10: Repeating step 7 to step 9 at least one time;

Step 11: Repeating step 5;

Step 12: Rotating the chuck assembly at a predefined high speed that ranges from 1000 to 3000 rpm, Step 13: Blowing a gas or a vapor for drying the flip chips with a flowrate from 1 slm to 10 slm, preferably from 4 slm to 6 slm, this process time can ranges from 20 to 200 s;

Step 14: Transferring the loading plate out of the process chamber 1400 back to the cassette;

Step 15: Bringing the flip chips out of the loading plate.

Although the present invention has been described with respect to certain embodiments, examples, and applications, it will be apparent to those skilled in the art that various modifications and changes may be made without departing from the invention.

FIG. 15a-15d illustrates cross-sectional views of another exemplary apparatus 1500 for cleaning flip chip assemblies.

Figure 15A:
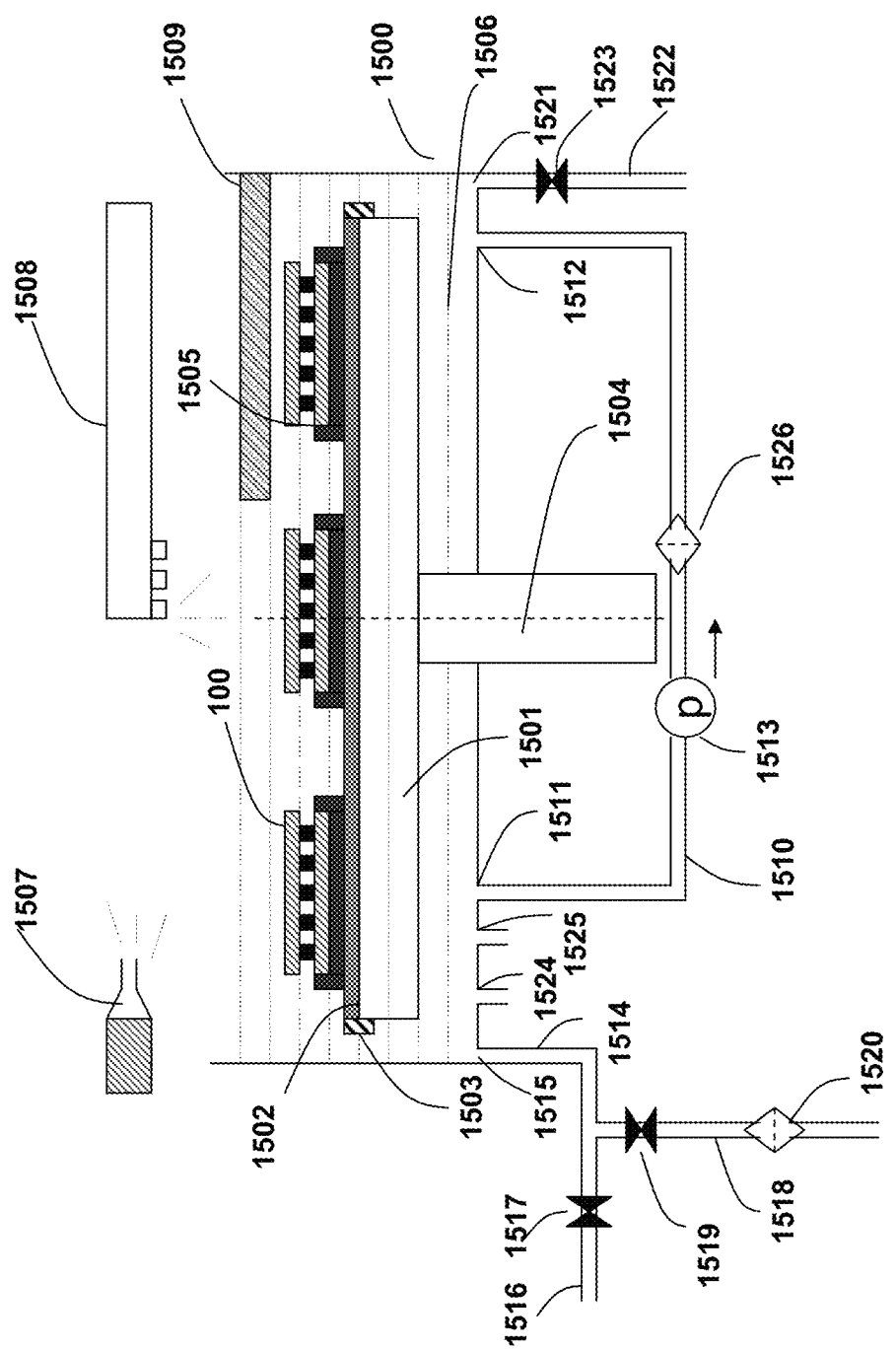
FIG. 15a-15d illustrates another exemplary apparatus for cleaning flip chip assemblies.
Figure 15B:
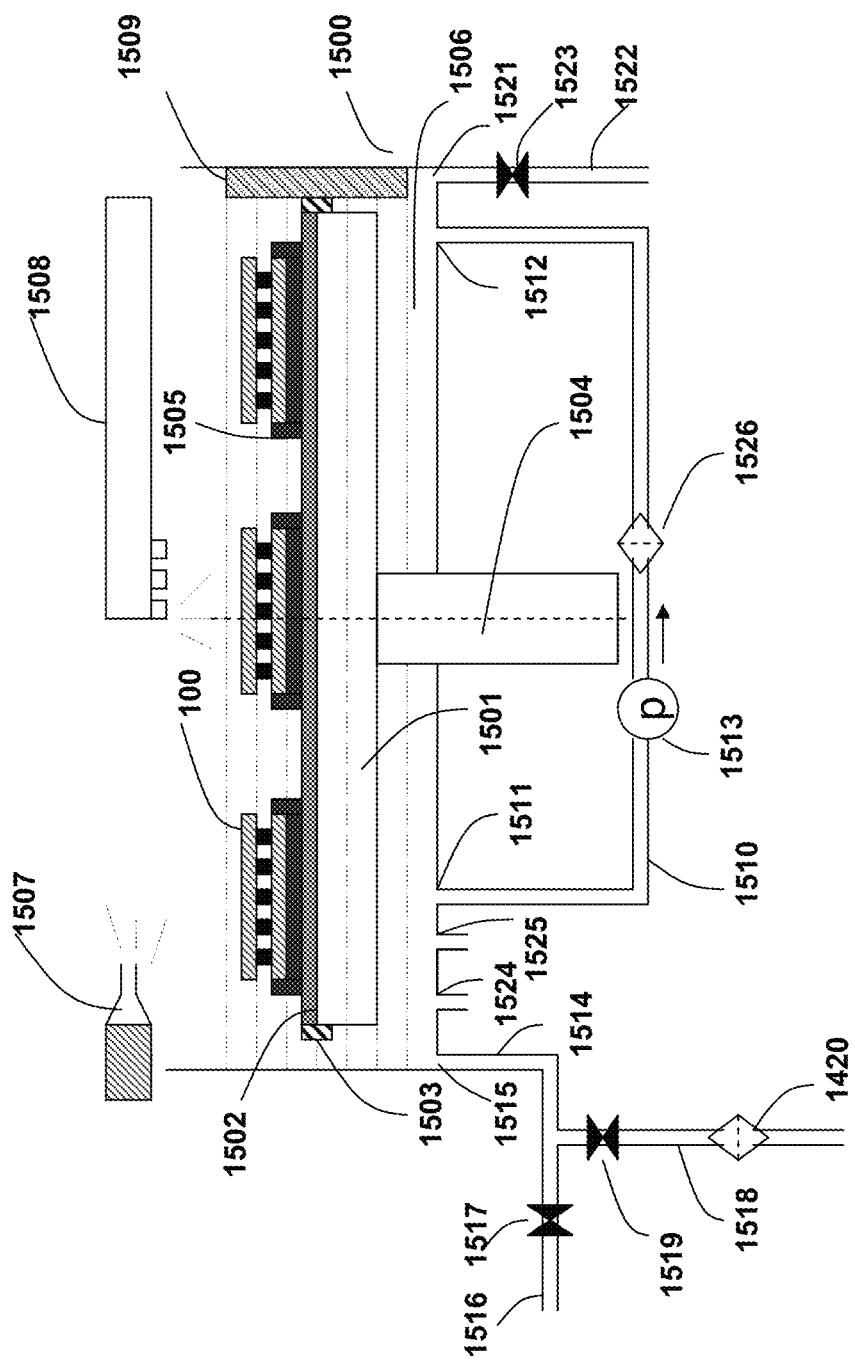
Figure 15C:
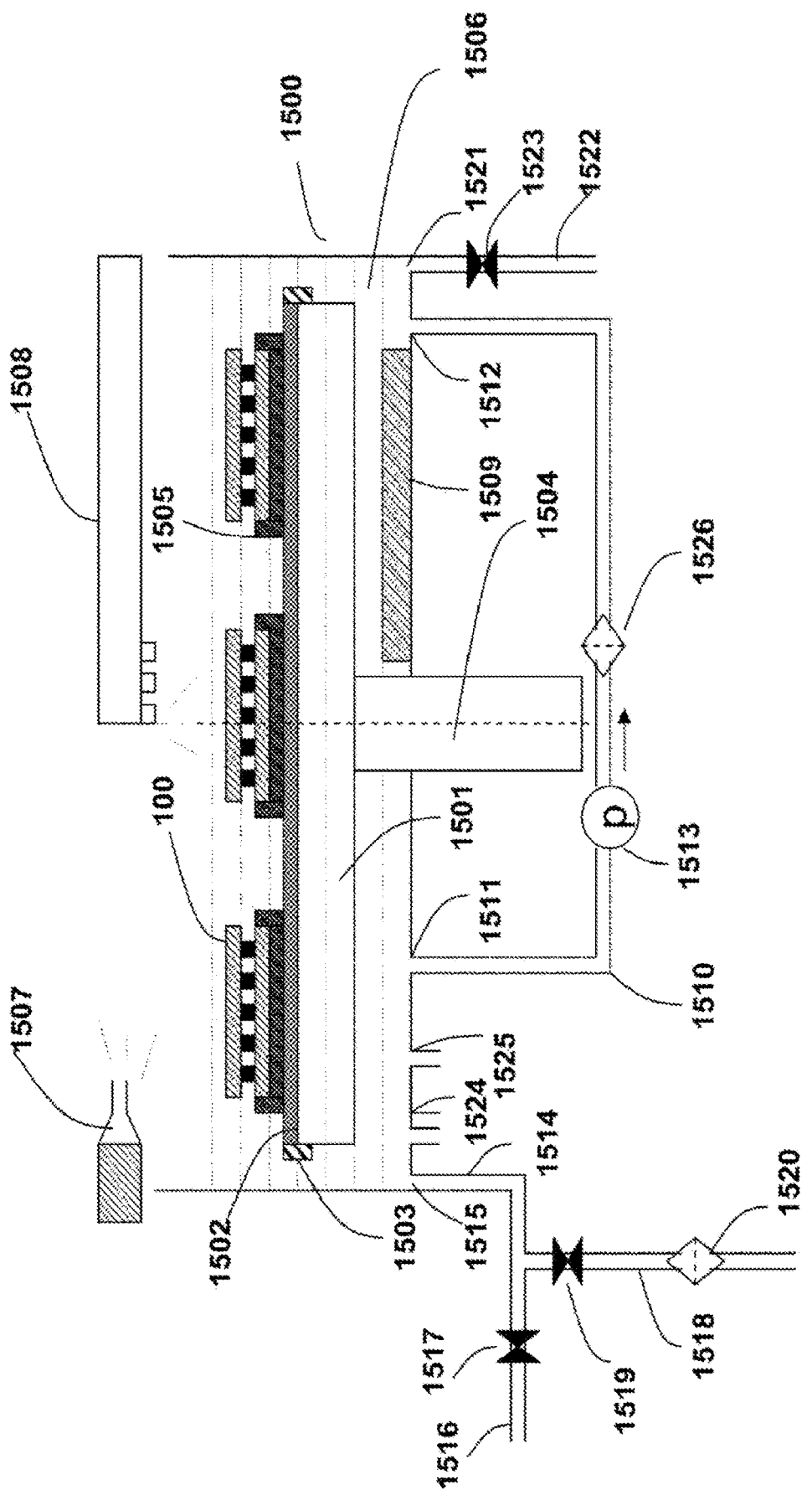
Figure 15D:
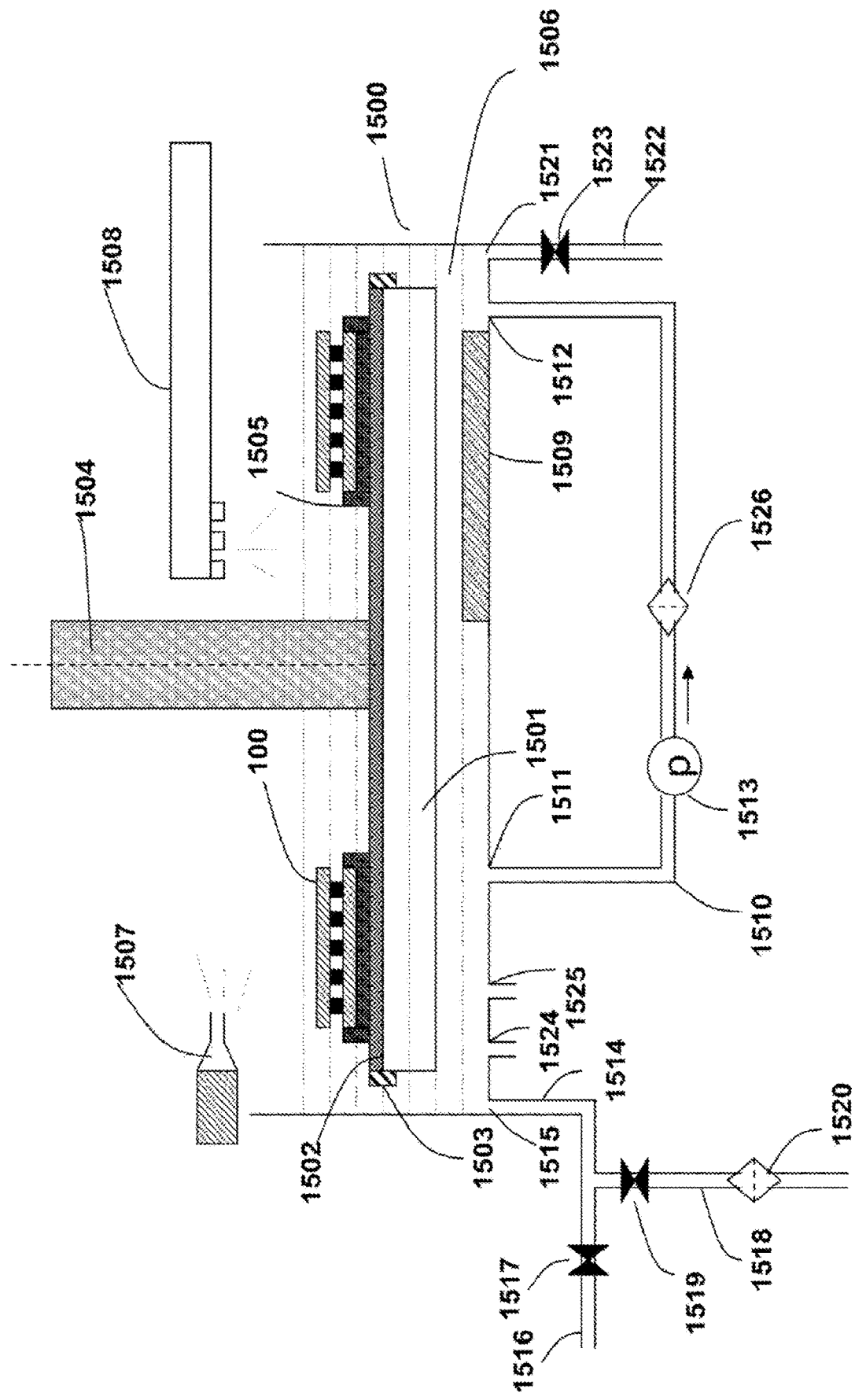

According to the present invention, the apparatus includes: a flip chip loading plate 1502 that holds at least one flip chip carrier 1505, each carrier holds one flip chip 100, the loading plate 1502 is fixed on the chuck 1501 by several mounting elements 1503; a motor (not shown in the figures) that is coupled to the chuck assembly by a spindle 1504; in one aspect of the invention, as indicated in FIGS. 15a-15c, the spindle is disposed at the bottom of the chuck assembly; in another aspect of the invention, as indicated in FIG. 15d, the spindle is disposed on top of the chuck assembly; an outer tank 1506 for holding cleaning solution for pre-soaking the flip chips; at least one ultrasonic/megasonic device 1509 attached on wall of the outer tank 1506, the ultrasonic/megasonic device can be disposed in a position above the chuck assembly (as indicated in FIG. 15a), at the tank side wall (as indicated in FIG. 15b), or at the tank bottom wall (as indicated in FIG. 15c-15d), the ultrasonic/megasonic device is operated in the range from 5 KHz to 10 MHz. The apparatus further includes at least one spray nozzle for directing DIW, a cleaning solution, a gas or a vapor. The spray nozzle can be a fix nozzle 1507, a scan nozzle or a swing nozzle 1508, or be assembled in an ultrasonic/megasonic device 1509. The number and arrangement of the spray nozzles are varied depending on actual requirements. At least four outflow ports 1515, 1521, 1524, 1525 are disposed at the bottom of the tank, from a first outlet 1515, a drain line 1517 and a reclaim line 1518 extend for solvent, a tube 1514 connecting the outlet 1515, the drain line 1516 and the reclaim line 1518 is separated from the conduit joint, a on-off valve 1517 is arranged in the drain line, an on-off valve 1519 and a filter 1520 are arranged in the reclaim line. During the process, a discharged solvent passing through the reclaim line will be treated by the filter 1520, and then flows into a reclaim tank for reuse; from a second outlet 1524, a drain line and a reclaim line (not show in the figure) extend for alkali; from a third outlet 1525, a drain line and a reclaim line extend for acid (not show in the figure); from a fourth outlet, a drain line 1522 extends for waste DIW, a on-off valve 1523 is arranged in the drain line; a circulation loop 1510 comprising a pump 1513 and a filter 1526 connects the tank 1506 with an outflow port 1511 and an inflow port 1512, the loading plate 1502 rotates as the chuck 1501 spins. During the rotation, DIW or a cleaning solution spraying onto the loading plate will be held in the outtank until the liquid level immerses the flip chip. Long time soaking process can loosen, soften and remove the contaminants. During the soaking process, the ultrasonic/megasonic device 1508 and the circulation pump 1513 are turned on, with the activation of the pump, liquid can be circulated continuously in the tank, combined with the ultrasonic/megasonic agitation, and then a high cleaning performance can be obtained.

According to the embodiment mentioned above, a method for cleaning flip chip assemblies can be set as follows:

Process Sequence

Step 1: Loading at least one flip chip 100 into the flip chip carriers 1505 held by a loading plate 1502;

Step 2: Placing the loading plate 1502 into a cassette;

Step 3: Transferring the loading plate 1502 into the process chamber 1500;

Step 4: Rotating the chuck assembly 1501 at a first lower speed ranges from 10 to 500 rpm;

Step 5: Flowing DIW onto the loading plate with a flowrate from 0.5 LPM to 5 LPM, preferably from 1.5 LPM to 3 LPM until the liquid level held in the tank 1506 immerses the flip chips;

Step 6: Turning on the circulation pump 1513 and the ultrasonic/megasonic device 1508 at a operating frequency from 5 KHz to 10 MHz, preferably from 1 MHz to 3 MHz;

Step 7: Soaking the flip chips in the liquid bath for 10 to 300 s;

Step 8: Turning off the ultrasonic/megasonic device 1508 and the circulation pump 1513;

Step 9: Opening the waste DIW drain line, discharge the waste DIW from the tank, Step 10: Closing the waste DIW drain line;

Step 11: Supplying a cleaning solution onto the loading plate at the first lower speed with a flowrate from 0.5 LPM to 5 LPM, preferably from 1.5 LPM to 3 LPM, the cleaning solution may be an organic solvent, like chlorofluorocarbon solvent, Hydrocarbon solvent or chlorinated solvent. The liquid will further spin into the flip chips 100 by centrifugal force, this process time can range from 10 to 60 s;

Step 12: Continuously supplying the cleaning solution, rotating the chuck assembly at a second higher speed that ranges from 500 to 2000 rpm, this process time can range from 10 to 60 s;

Step 13: Repeating step 11 to step 12 until the liquid level held in the tank 1506 immerses the flip chips;

Step 14: Slowing down the chuck speed to the first lower speed that ranges from 10 to 500 rpm;

Step 15: Turning on the circulation pump 1513 and the ultrasonic/megasonic device 1509 at a operating frequency from 5 KHz to 10 MHz, preferably from 1 MHz to 3 MHz;

Step 16: Soaking the flip chips in the liquid bath for 10 to 500 s;

Step 17: Turning off the ultrasonic/megasonic device 1509 and the circulation pump 1513;

Step 18: Opening the specific reclaim line, recycling the used liquid from the tank to a reclaim tank for reutilization;

Step 19: Closing the specific reclaim line;

Step 20: Repeat step 5 to step 10;

Step 21: Rotating the chuck assembly at a predefined high speed that ranges from 1000 to 3000 rpm, Step 22: Blowing a gas or a vapor for drying the flip chips with a flowrate from 1 slm to 10 slm, preferably from 4 slm to 6 slm, this process time can range from 20 to 200 s;

Step 23: Transferring the loading plate out of the process chamber 1500 back to the cassette;

Step 24: Bringing the flip chips out of the loading plate.

Although the present invention has been described with respect to certain embodiments, examples, and applications, it will be apparent to those skilled in the art that various modifications and changes may be made without departing from the invention.

What is claimed is:

1. A method for cleaning flip chip assemblies comprising:
loading at least one flip chip to one or more flip chip carriers held by a chuck assembly at the periphery of the chuck assembly, wherein the chuck assembly comprises a recess located in the center of the chuck assembly and one or more guide channels connecting the recess with the one or more flip chip carriers;
wherein the at least one flip chip is oriented in a horizontal configuration on the chuck assembly;
performing a cleaning process to clean the at least one flip chip, the cleaning process comprising:
supplying a cleaning solution for removing contaminants onto the recess while rotating the chuck assembly at a low rotation speed, wherein the cleaning solution spins into the one or more flip chips through the one or more guide channels due to centrifugal forces and is held in the one or more flip chips without being scattered outward under dominance of surface tension, wherein the cleaning solution has a liquid density p and a surface tension coefficient σ;

continuously supplying the cleaning solution while rotating the chuck assembly at a high rotation speed wherein a centrifugal force overcomes the surface tension and allows the cleaning solution and contaminants trapped therein to be dragged out; and repeating the cycling of rotating the chuck assembly at the low rotation speed and rotating the chuck assembly at the high rotation speed at least once;

wherein the low rotation speed and high rotation speed is determined based upon a length B of the at least one flip chip, a width A of the at least one flip chip, a radius r of position of the one or more flip chip carriers on the chuck assembly, a space h between two chip bond pads of the at least one flip chip, a chuck spin time t during the rotating step, the liquid density of the cleaning solution, and the liquid surface tension coefficient of the cleaning solution;

said low rotation speed $N_l$ is in a range less than $$\frac{60 \times \left(\frac{2\sigma}{\rho h A r} + \frac{2B}{rt^2}\right)^{\frac{1}{2}}}{2\pi};$$

said high rotation speed $N_h$ is in a range higher than $$\frac{60 \times \left(\frac{2\sigma}{\rho h A r} + \frac{2B}{rt^2}\right)^{\frac{1}{2}}}{2\pi}.$$

2. The method of claim 1, further comprising:

applying ultrasonic or megasonic energy to the at least one flip chip during the cleaning process.

3. The method of claim 1, further comprising:

blowing a gas or a vapor via spray nozzles for drying the at least one flip chip.

4. The method of claim 1, wherein the one or more flip chip carriers are held by a loading plate, the method further comprising:

placing the loading plate into a cassette; and transferring the loading plate from the cassette to the chuck assembly.

* * * * *